US012740077B2

(12) United States Patent
Lee et al.

(10) Patent No.: US 12,740,077 B2
(45) Date of Patent: Sep. 15, 2026

(54) INTEGRATED CIRCUIT DEVICE

(71) Applicant: Samsung Electronics Co., Ltd., Suwon-si (KR)

(72) Inventors: Gina Lee, Suwon-si (KR); Seil Oh, Suwon-si (KR); Inseok Baek, Suwon-si (KR); Changsik Yoo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 364 days.

(21) Appl. No.: 18/598,552

(22) Filed: Mar. 7, 2024

(65) Prior Publication Data

US 2024/0304661 A1 Sep. 12, 2024

(30) Foreign Application Priority Data

Mar. 9, 2023 (KR) ........................ 10-2023-0031363

(51) Int. Cl.
*H10B 12/00* (2023.01)
*H10D 1/68* (2025.01)

(52) U.S. Cl.
CPC ............. *H10D 1/716* (2025.01); *H10B 12/30* (2023.02); *H10B 12/50* (2023.02)

(58) Field of Classification Search
None
See application file for complete search history.

(56) References Cited

U.S. PATENT DOCUMENTS 6,551,895 B1 * 4/2003 Hsu ........................ H10B 12/50 257/E29.345
8,134,398 B2 * 3/2012 Kadoya ................ H10B 12/053 257/E27.084
9,099,473 B2 8/2015 Kim et al.
9,520,401 B2 12/2016 Lee
9,825,146 B2 11/2017 Lim
2013/0099298 A1 4/2013 Kim
2016/0099248 A1 4/2016 Wu
2022/0037508 A1 * 2/2022 Kim ..................... H10B 12/053

* cited by examiner

*Primary Examiner* — Cory W Eskridge
(74) *Attorney, Agent, or Firm* — Muir Patent Law, PLLC

(57) ABSTRACT

An integrated circuit device includes a substrate including a cell array region and a peripheral circuit region, a first ion implantation region located in an upper portion of the substrate in the peripheral circuit region, the first ion implantation region having a plurality of line trenches that extend in a first horizontal direction and cross the first ion implantation region, a plurality of lower capacitor dielectric films with each lower capacitor dielectric film configured to respectively cover inner walls of a respective line trench, a plurality of buried conductive lines that each partially fill a respective line trench and that are each respectively disposed on a respective lower capacitor dielectric film, a plurality of first lower capacitor contacts that are each in contact with a respective buried conductive line, and a plurality of second lower capacitor contacts that are in contact with the first ion implantation region.

20 Claims, 34 Drawing Sheets

UCS
194
192
196
173a
152a
142
136
BCS
134
132
X21'
T1
212
214
204
202
182
173b
164
162
152b
110M
124
122
110
LV1
LV2
X21

UCS
194
192
196
175b
142
136
BCS
134
132
X41'
T1
212
214
204
202
182
175a
164
162
154a
110M
110
LV1
X41

UCS
194
192
196
179b
142
136
112
134
BCS
132
X71'
T1
212
214
204
202
182
179a
164
162
158a
110M
114
114T
LV4
LV1
110
X71
Z
Y
X

INTEGRATED CIRCUIT DEVICE

CROSS-REFERENCE TO RELATED APPLICATION

This application is based on and claims priority under 35 U.S.C. § 119 to Korean Patent Application No. 10-2023-0031363, filed on Mar. 9, 2023, in the Korean Intellectual Property Office, the disclosure of which is incorporated by reference herein in its entirety.

BACKGROUND

The inventive concept relates to an integrated circuit device. More specifically, the inventive concept relates to an integrated circuit device including a capacitor.

Recently, as the degree of integration of transistors gradually increases, various studies are being conducted to mitigate leakage current due to a short channel effect. In a buried channel array transistor (BCAT) provided in a cell array region, such as a memory cell region of an integrated circuit device, a gate electrode may be buried in a substrate to mitigate the short channel effect.

In order to improve distribution characteristics of metal etch back for a gate electrode of the memory cell region of the integrated circuit device, a dummy BCAT is formed in a portion of a peripheral circuit region that surrounds the memory cell region.

SUMMARY

The inventive concept provides an integrated circuit device having improved reliability.

According to an aspect of the inventive concept, there is provided an integrated circuit device. The integrated circuit device includes a substrate including a cell array region and a peripheral circuit region, the first ion implantation region having a plurality of line trenches that extend in a first horizontal direction and cross the first ion implantation region, a first ion implantation region located in an upper portion of the substrate in the peripheral circuit region, a plurality of lower capacitor dielectric films configured with each lower capacitor dielectric film configured to respectively cover inner walls of a respective line trench of the plurality of line trenches, a plurality of buried conductive lines that each partially fill a respective line trench of the plurality of line trenches and that are each respectively disposed on a respective lower capacitor dielectric film of the plurality of lower capacitor dielectric films, a plurality of first lower capacitor contacts that are each respectively in contact with a respective buried conductive line of the plurality of buried conductive lines, and a plurality of second lower capacitor contacts that are in contact with the first ion implantation region.

According to another aspect of the inventive concept, there is provided an integrated circuit device. The integrated circuit device includes a substrate including a cell array region and a peripheral circuit region having a plurality of line trenches that extend in a first horizontal direction in the peripheral circuit region, a plurality of buried conductive lines that are each respectively arranged inside a respective line trench of the plurality of line trenches, a plurality of first lower capacitor contacts that are each in contact with a respective buried conductive line of a first group of buried conductive lines selected from among the plurality of buried conductive lines, and a plurality of second lower capacitor contacts that are each in contact with a respective buried conductive line of a second group of buried conductive lines selected from among the plurality of buried conductive lines, wherein the first group of buried conductive lines and the second group of buried conductive lines are alternately arranged in a second horizontal direction perpendicular to the first horizontal direction.

According to another aspect of the inventive concept, there is provided an integrated circuit device. The integrated circuit device includes a substrate including a cell array region and a peripheral circuit region, a buried capacitor structure located inside the substrate in the peripheral circuit region, an upper capacitor structure disposed above the substrate in the peripheral circuit region, a first conductive pad and a second conductive pad, which are each connected to the upper capacitor structure above the substrate, a plurality of first lower capacitor contacts configured to connect the first conductive pad to the buried capacitor structure, and a plurality of second lower capacitor contacts configured to connect the second conductive pad to the buried capacitor structure, wherein the buried capacitor structure includes a first ion implantation region located in an upper portion of the substrate, a plurality of lower capacitor dielectric films with each lower capacitor dielectric film configured to respectively cover inner walls of a respective line trench of a plurality of line trenches that extend in a first horizontal direction and cross the first ion implantation region, and a plurality of buried conductive lines that each partially fill a respective line trench of the plurality of line trenches and that are each respectively disposed on a respective lower capacitor dielectric film of the plurality of lower capacitor dielectric films, wherein the plurality of first lower capacitor contacts are each respectively in contact with the a respective buried conductive line of the plurality of buried conductive lines, and the plurality of second lower capacitor contacts are in contact with the first ion implantation region.

BRIEF DESCRIPTION OF THE DRAWINGS

Embodiments will be more clearly understood from the following detailed description taken in conjunction with the accompanying drawings in which:

FIG. 3A is a schematic plan layout for describing some components of a peripheral circuit region;

FIG. 4 is a schematic plan layout for describing some components of a peripheral circuit region of an integrated circuit device according to some embodiments;

FIG. 5A is a schematic plan layout for describing some components of a peripheral circuit region of an integrated circuit device according to some embodiments;

FIG. 5B is an enlarged view of region "EX2" of FIG. 5A;

FIG. 5C is a cross-sectional view taken along line X21-X21' of FIG. 5B.

FIG. 8A is a schematic plan layout for describing some components of a peripheral circuit region of an integrated circuit device according to some embodiments;

FIG. 8C is a cross-sectional view taken along line X41-X41' of FIG. 8B.

FIG. 9A is a schematic plan layout for describing some components of a peripheral circuit region of an integrated circuit device according to some embodiments;

FIG. 11A is a schematic plan layout for describing some components of a peripheral circuit region of an integrated circuit device according to some embodiments;

FIG. 11C is a cross-sectional view taken along line X61-X61' of FIG. 11B.

FIG. 12A is a schematic plan layout for describing some components of a peripheral circuit region of an integrated circuit device according to some embodiments;

FIG. 12B is an enlarged view of region "EX7" of FIG. 12A; and

FIG. 12C is a cross-sectional view taken along line X71-X71' of FIG. 12B.

DETAILED DESCRIPTION OF THE EMBODIMENTS

Figure 1:
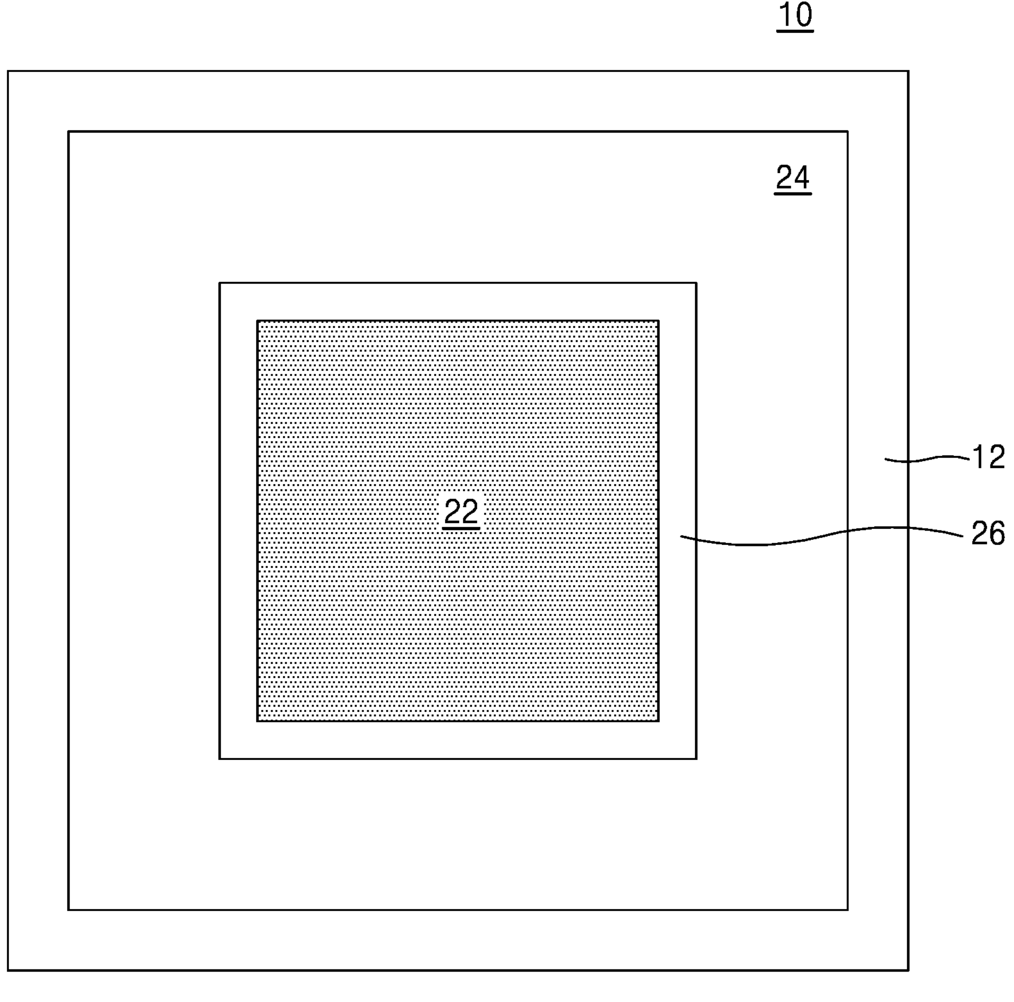
FIG. 1 is a plan view illustrating a schematic configuration of an integrated circuit device according to some embodiments of the inventive concept.
Figure 1:
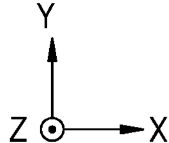

Hereinafter, embodiments are described in detail with reference to the accompanying drawings. The same reference numerals are given to the same elements in the drawings, and repeated descriptions thereof may be omitted. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

Unless otherwise indicated, in the following description directions are in reference to a plan view of a substrate. Thus, the horizontal plane is a plane parallel to a plane of the plan view and horizontal directions are directions parallel to the horizontal plane. A vertical direction is a direction that is perpendicular to the horizontal plane. Spatially relative terms, such as "beneath," "below," "lower," "above," "upper," "top," "bottom," and the like, may be used herein for ease of description to describe positional relationships, such as illustrated in the figures, for example. Unless otherwise indicated, the spatially relative terms are in reference to horizontal and vertical directions as described above. It will be understood that the spatially relative terms encompass different orientations of the device in addition to the orientation depicted in the figures.

Also, these spatially relative terms such as "above" and "below" as used herein have their ordinary broad meanings—for example element A can be above element B even if when looking down on the two elements there is no overlap between them (just as something in the sky is generally above something on the ground, even if it is not directly above).

FIG. 1 is a plan view illustrating a schematic configuration of an integrated circuit device 10 according to some embodiments of the inventive concept.

Referring to FIG. 1, the integrated circuit device 10 may include a substrate 12 that includes a cell array region such as a memory cell region 22, a peripheral circuit region 24 enclosing (e.g., surrounding horizontally) the memory cell region 22, and an interface region 26 between the memory cell region 22 and the peripheral circuit region 24.

The substrate 12 may be formed of and/or include, for example, a semiconductor element such as Si or Ge, or at least one compound semiconductor selected from among SiGe, SiC, GaAs, InAs, and InP. The substrate 12 may include a conductive region, for example, a well doped with dopants or a structure doped with dopants.

According to some embodiments, the memory cell region 22 may include a memory cell region of dynamic random access memory (DRAM). The memory cell region 22 may include a plurality of unit memory cells that include transistors and capacitors. The peripheral circuit region 24 may have a region in which peripheral circuits for driving the memory cells of the memory cell region 22 are arranged and may include a capacitor. The interface region 26 may be provided with a plurality of conductive lines arranged to establish electrical connection between the memory cell region 22 and the peripheral circuit region 24 and insulating structures for insulation between the memory cell region 22 and the peripheral circuit region 24.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

As used herein, an "electrical connection" between components, or components described as being "electrically connected" are configured such that an electrical signal can be transferred from one component to the other (although such electrical signal may be attenuated in strength as it is transferred and may be selectively transferred). Moreover, components that are "directly electrically connected" share a common electrical node through electrical connections by one or more conductors, such as, for example, wires, pads, internal electrical lines, through vias, etc. As such, directly electrically connected components do not include components electrically connected through active elements, such as transistors or diodes.

Figure 2:
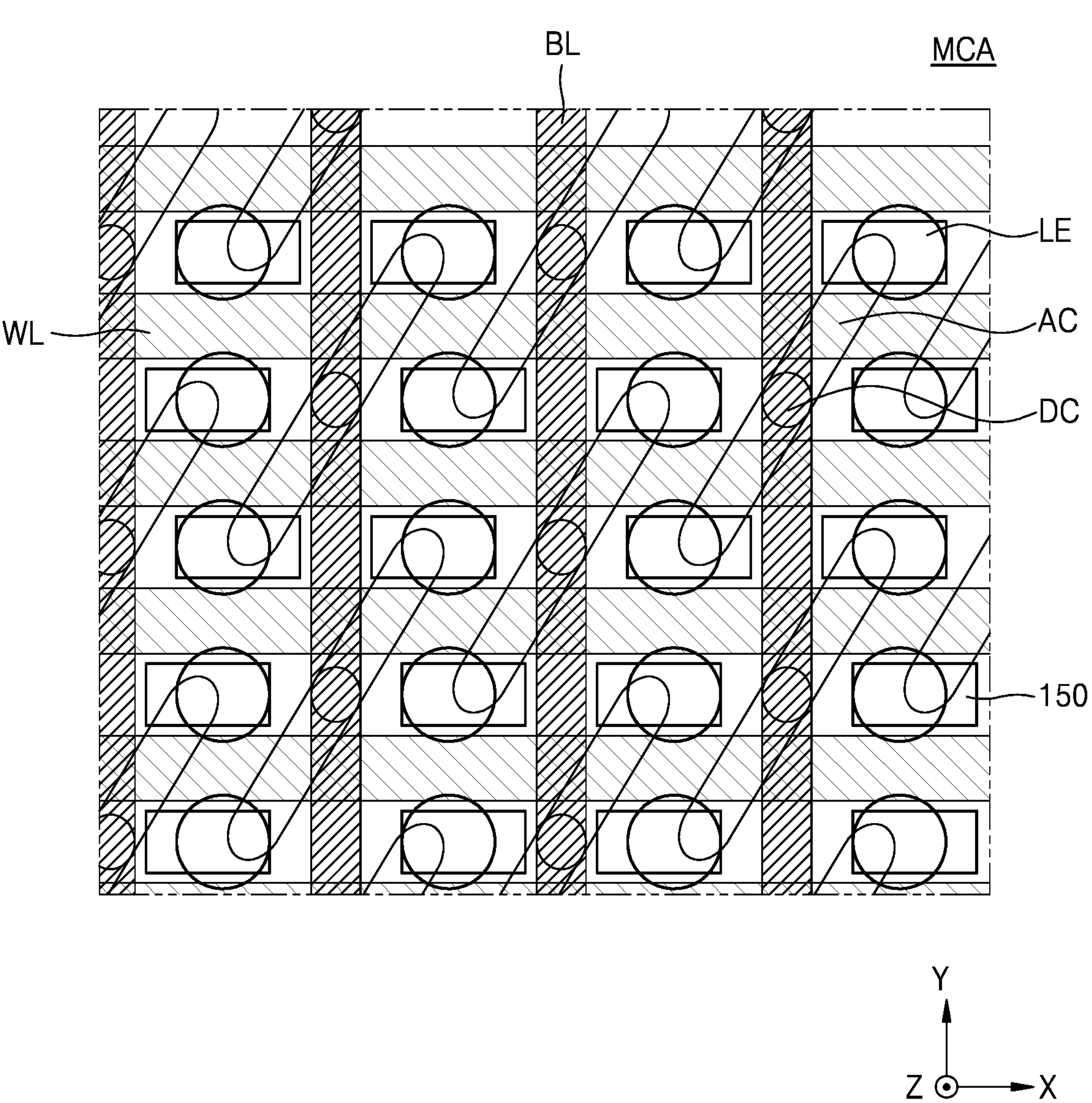
FIG. 2 is a schematic plan layout for describing some components of a memory cell region.

FIG. 2 is a schematic plan layout for describing some components of a memory cell region MCA of the integrated circuit device 10. The memory cell region MCA may correspond to the memory cell region 22 of FIG. 1.

Referring to FIG. 2, the integrated circuit device 10 may include a plurality of active regions AC that horizontally extend in a diagonal direction with respect to a first horizontal direction (X direction) and a second horizontal direction (Y direction) perpendicular to each other in a plan view in the memory cell region MCA. A plurality of word lines WL may be parallel to each other and extend in the first horizontal direction (X direction) across the plurality of active regions AC. According to some embodiments, the plurality of word lines WL may be buried in the substrate 12, and the integrated circuit device 10 may include a buried channel array transistor (BCAT) structure.

Ordinal numbers such as "first," "second," "third," etc. may be used simply as labels of certain elements, steps, etc., to distinguish such elements, steps, etc. from one another and, unless otherwise indicated, do not indicate a particular order. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The term "buried" may refer to structures, patterns, and/or layers that are formed at least partially below a top surface of another structure, pattern, and/or layer. In some embodiments, when a first structure, pattern, and/or layer is "buried" in a second structure, pattern, and/or layer, the second structure, pattern, and/or layer may surround at least a portion of the first structure, pattern, and/or layer. For example, a first structure, pattern, and/or layer first may be considered to be buried when it is at least partially embedded in a second structure, pattern, and/or layer.

A plurality of bit lines BL may be parallel to each other, provided on the plurality of word lines WL, and extend in the second horizontal direction (Y direction). The plurality of bit lines BL may be respectively connected to the active regions AC via direct contacts DC.

A plurality of cell capacitor contacts 150 may be arranged with each cell capacitor contact 150 between two respective adjacent bit lines BL among the plurality of bit lines BL, and each of a plurality of lower electrodes LE spaced apart from each other may be formed on a respective cell capacitor contact 150 of the plurality of cell capacitor contacts 150. Each of the plurality of lower electrodes LE may be respectively connected to a respective active region AC of the plurality of active regions AC via a respective cell capacitor contact 150 of the plurality of cell capacitor contacts 150. Although not illustrated, a lower electrode LE of the plurality of lower electrodes LE may face an upper electrode (not shown) with a dielectric film (not shown) therebetween and constitute a cell capacitor together with the dielectric film (not shown) and the upper electrode (not shown).

Figure 3A:
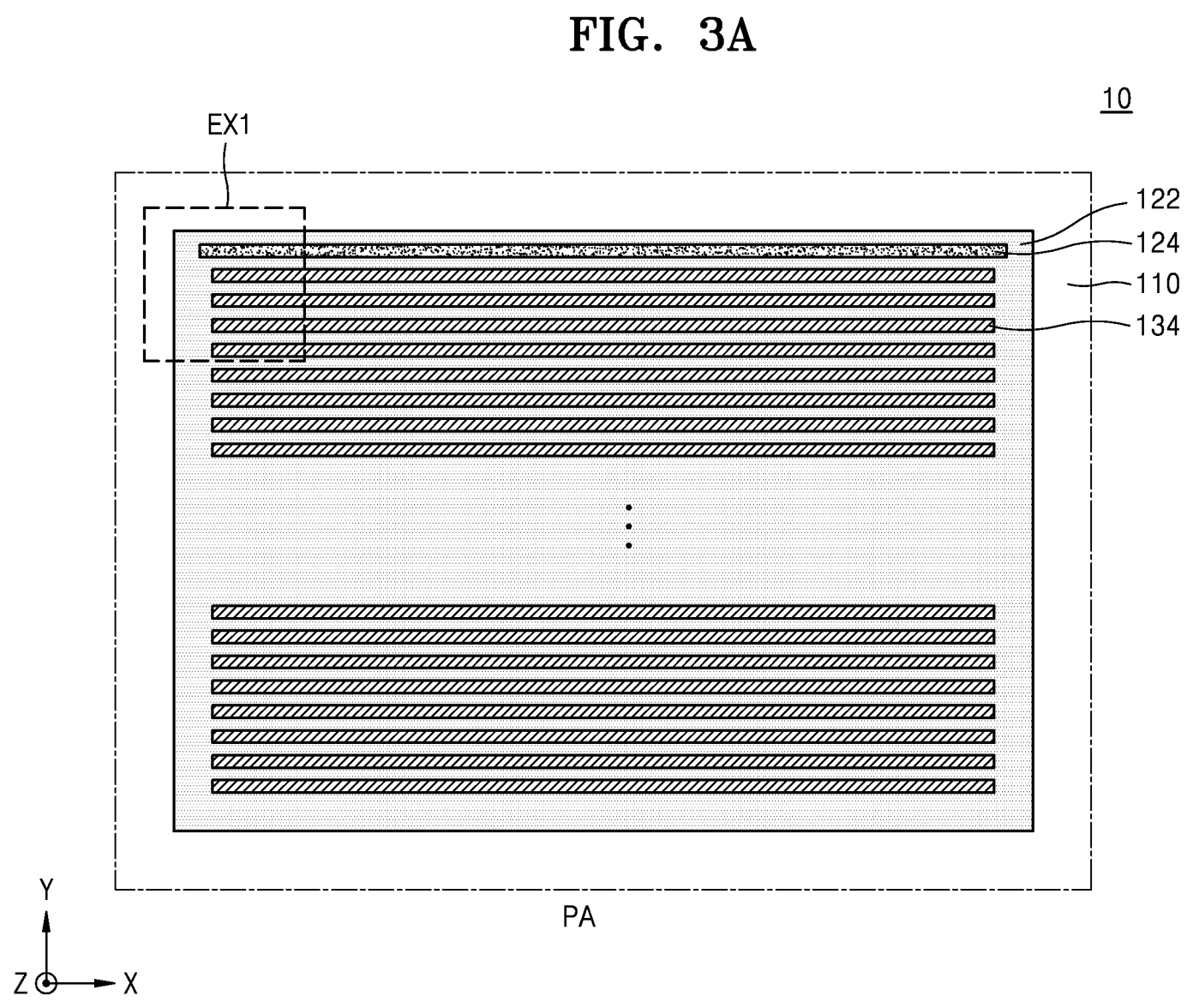
Figure 3B:
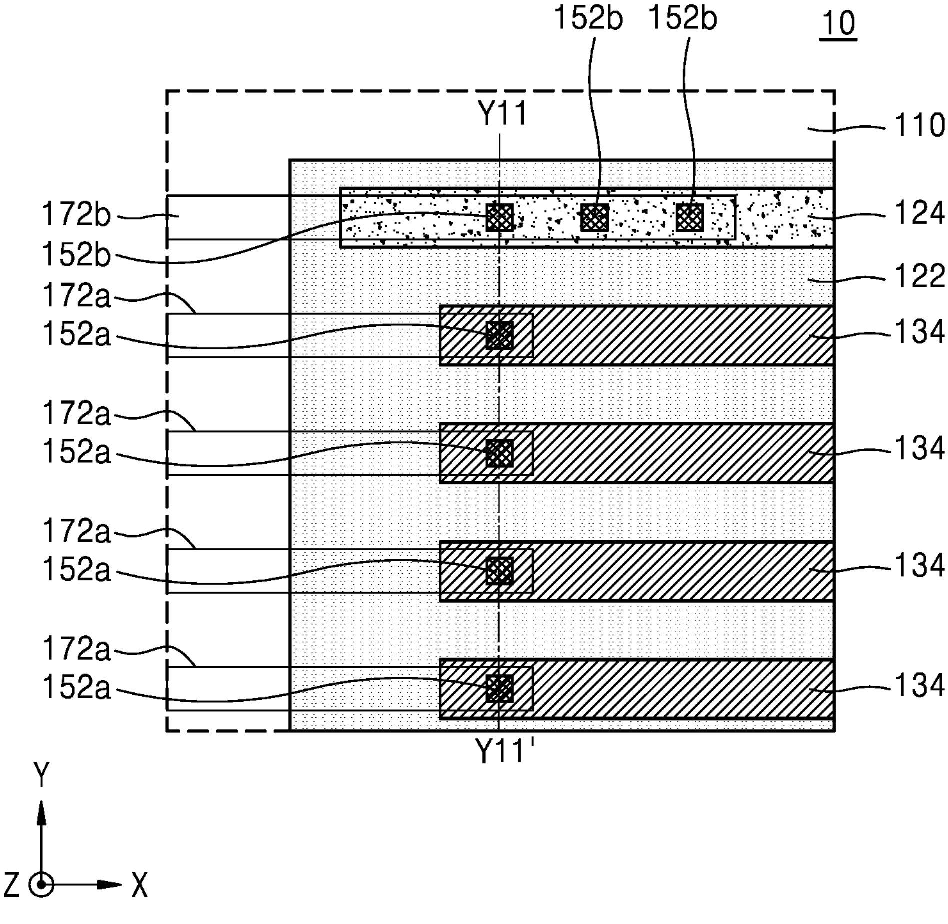
FIG. 3B is an enlarged view of region "EX1" of FIG. 3A.
Figure 3C:
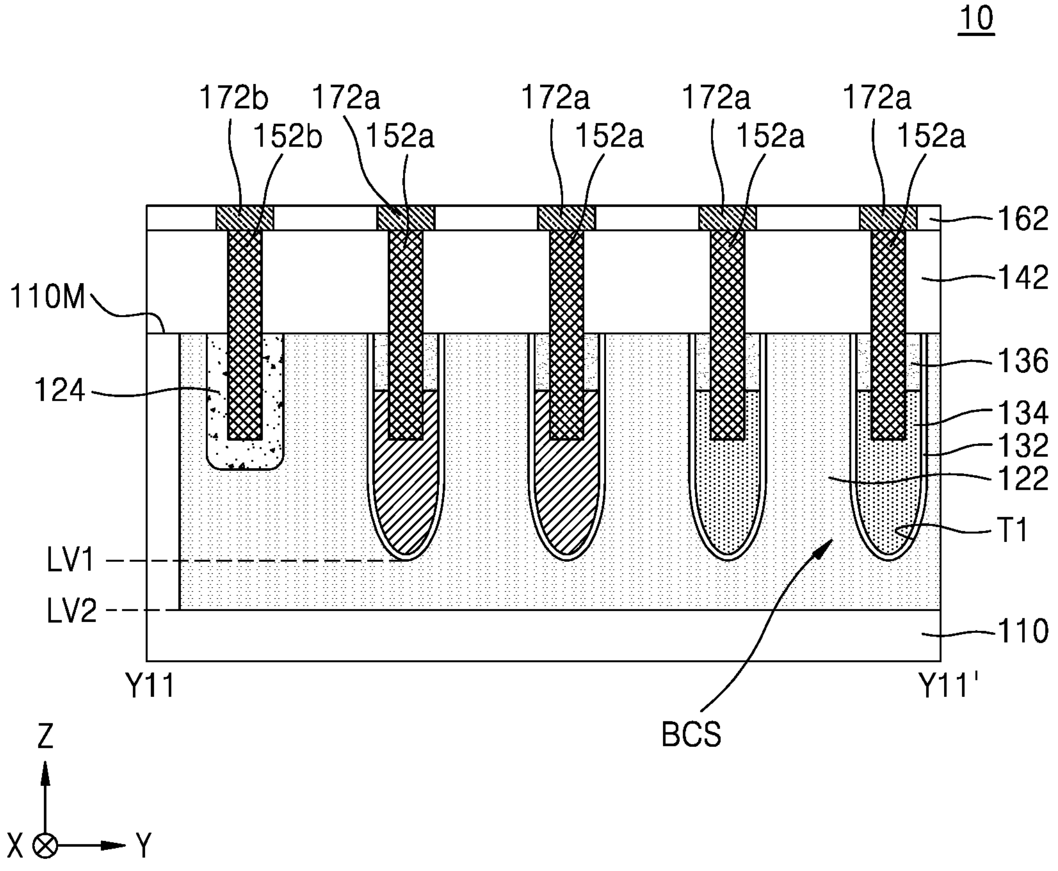
FIG. 3C is a cross-sectional view taken along line Y11-Y11' of FIG. 3B.

FIG. 3A is a schematic plan layout for describing some components of a peripheral circuit region PA of an integrated circuit device 10 according to some embodiments. The peripheral circuit region PA may correspond to the peripheral circuit region 24 of FIG. 1. FIG. 3B is an enlarged view of region "EX1" of FIG. 3A. FIG. 3C is a cross-sectional view taken along line Y11-Y11' of FIG. 3B.

Referring to FIGS. 3A and 3B, a first well 122 may be located inside the peripheral circuit region PA of the substrate 110. Also, a plurality of buried conductive lines 134, which are parallel to each other and extend in a first horizontal direction (X direction) parallel to a main surface 110M of the substrate 110, may be arranged inside the first well 122. The substrate 110 may correspond to the substrate 12 illustrated in FIG. 1.

According to some embodiments, the first well 122 provided as a part of the substrate 110 may include an ion implantation region doped with a dopant and may be located in an upper portion of the substrate 110 and exposed from the main surface 110M of the substrate 110. In some embodiments, the first well 122 may include a semiconductor layer doped with a p-type dopant. For example, the p-type dopant may include boron (B) or gallium (Ga). In some embodiments, the first well 122 may include a semiconductor layer doped with an n-type dopant. For example, the n-type dopant may include phosphorus (P), arsenic (As), or antimony (Sb). For example, the substrate 110 may include a p-type semiconductor substrate, and the first well 122 may have n-type characteristics.

According to some embodiments, the plurality of buried conductive lines 134 may be respectively arranged in a plurality of line trenches T1 that extend parallel to each other while crossing a portion of the first well 122 in the first horizontal direction (X direction). According to some embodiments, a plurality of lower capacitor dielectric films 132 may be arranged to respectively and conformally cover inner walls of the plurality of line trenches T1, and the plurality of buried conductive lines 134 may be arranged on the plurality of lower capacitor dielectric films 132 while partially filling the plurality of line trenches T1. A capping insulating film 136 may be disposed on the plurality of buried conductive lines 134 to cover upper surfaces of the plurality of buried conductive lines 134 and may fill remaining portions of the plurality of line trenches T1.

According to some embodiments, the plurality of buried conductive lines 134 arranged in the peripheral circuit region PA may be formed through the same process as the word lines WL arranged in the memory cell region MCA illustrated in FIG. 2 and may have a structure similar to that of the word lines WL (e.g., a structure buried in the substrate 110). For example, the buried conductive lines 134 having a structure similar to that of the word lines WL of the memory cell region MCA are arranged in the peripheral circuit region PA, and thus, the balance between the memory cell region MCA and the peripheral circuit region PA may be improved and distribution characteristics of a metal etch back process for forming the word lines WL may be improved.

According to some embodiments, the plurality of buried conductive lines 134 may be spaced apart from each other in a second horizontal direction (Y direction) with a respective portion of the first well 122 therebetween. For example, the respective portion of the first well 122 may be between a pair of buried conductive lines 134 adjacent to each other in the second horizontal direction (Y direction) among the plurality of buried conductive lines 134. According to some embodiments, the plurality of buried conductive lines 134 may have surfaces that face the first well 122 with the lower capacitor dielectric films 132 therebetween.

In some embodiments, the plurality of buried conductive lines 134 may be located inside the first well 122. According to some embodiments, the bottom surface of the first well 122 may be at a lower vertical level than the bottom surfaces of the plurality of line trenches T1. As used herein, the term "vertical level" represents a height in the vertical direction (Z direction or −Z direction). In some embodiments, the bottom surfaces of the plurality of line trenches T1 may be at a first vertical level LV1, and the bottom surface of the first well 122 may be at a second vertical level LV2 that is lower than the first vertical level LV1. In some embodiments, a vertical level of the bottom surface of the plurality of buried conductive lines 134 may be higher than the second vertical level LV2. For example, lower portions of the plurality of buried conductive lines 134 may be surrounded by the first well 122.

In some embodiments, each of the lower capacitor dielectric films 132 may be formed of and/or include at least one selected from among a silicon oxide film, a silicon nitride film, a silicon oxynitride film, an oxide/nitride/oxide (ONO) film, or a high-k dielectric film having a higher dielectric constant than the silicon oxide film. The high-k dielectric film may be formed of and/or include $HfO_2$, $Al_2O_3$, $HAlO_3$, $Ta_2O_3$, $TiO_2$, or a combination thereof. In some embodiments, each of the plurality of buried conductive lines 134 may be formed of and/or include Ti, TiN, Ta, TaN, W, WN, TiSiN, WSiN, or a combination thereof. In some embodiments, each of a plurality of capping insulating films 136 may include a silicon oxide film, a silicon nitride film, a silicon oxynitride film, or a combination thereof.

According to some embodiments, a second well 124 may be located in a portion of the first well 122. For example, the second well 124 provided as a part of the substrate 110 may include an ion implantation region doped with a dopant and may be located in an upper portion of the first well 122 and exposed from the main surface 110M of the substrate 110.

In some embodiments, the second well 124 may include a region doped with a dopant having the same conductivity type as the first well 122. In some embodiments, a doping concentration of the second well 124 may be greater than a doping concentration of the first well 122.

According to some embodiments, the second well 124 may be spaced apart from the plurality of buried conductive lines 134 in the horizontal direction (X direction and/or Y direction) and arranged inside the first well 122. For example, the second well 124 may have a bar-type structure that extends lengthwise in the first horizontal direction (X direction) in a plan view. An item, layer, or portion of an item or layer described as extending "lengthwise" in a particular direction has a length in the particular direction and a width perpendicular to that direction, where the length is greater than the width.

According to some embodiments, a first interlayer insulating layer 142 may be disposed on the main surface 110M of the substrate 110. For example, the first interlayer insulating layer 142 may cover the upper surface of the substrate 110, the upper surface of the first well 122, the upper surface of the second well 124, and the upper surface of the capping insulating film 136. In some embodiments, the first interlayer insulating layer 142 may include a silicon oxide film, a silicon nitride film, a silicon oxynitride film, or a combination thereof, but embodiments are not limited thereto.

According to some embodiments, a plurality of first lower capacitor contacts 152*a* are respectively arranged above the plurality of buried conductive lines 134. The first lower capacitor contacts 152*a* may pass through the first interlayer insulating layer 142 and the plurality of capping insulating films 136 and respectively come into contact with a respective buried conductive line of the plurality of buried conductive lines 134. In some embodiments, the plurality of first lower capacitor contacts 152*a* may pass through the upper surfaces of the plurality of buried conductive lines 134, and respective portions of the plurality of first lower capacitor contacts 152*a* may extend into respective buried contact lines 134 of the plurality of buried conductive lines 134.

According to some embodiments, a plurality of second lower capacitor contacts 152*b* may be arranged above the second well 124. The second lower capacitor contacts 152*b* may pass through the first interlayer insulating layer 142 and come into contact with the second well 124. In some embodiments, the plurality of second lower capacitor contacts 152*b* may pass through the upper surface of the second well 124 and partially extend into the second well 124. FIG. 3B illustrates that three second lower capacitor contacts 152*b* are connected to the second well 124, but embodiments are not limited thereto. For example, the integrated circuit device 10 may include one or more second lower capacitor contacts 152*b*.

In some embodiments, each of the plurality of first lower capacitor contacts 152*a* and the plurality of second lower capacitor contacts 152*b* may be formed of and/or include a semiconductor material doped with a dopant, a metal, a conductive metal nitride, or a combination thereof. In some embodiments, each of the plurality of first lower capacitor contacts 152*a* and the plurality of second lower capacitor contacts 152*b* may include a doped polysilicon film, an epitaxially grown silicon film, or a combination thereof.

According to some embodiments, the plurality of buried conductive lines 134 and the second well 124 may be configured to receive voltages of different magnitudes via the plurality of first lower capacitor contacts 152*a* and the plurality of second lower capacitor contacts 152*b*, respectively. For example, the first well 122 may be electrically connected to the plurality of second lower capacitor contacts 152*b* via the second well 124 such that a voltage applied to the second lower capacitor contacts 152*b* is transmitted to the first well 122. In some embodiments, the magnitude of a first voltage applied to the plurality of buried conductive lines 134 via the plurality of first lower capacitor contacts 152*a* may be lower than the magnitude of a second voltage applied to the first well 122 via the second lower capacitor contacts 152*b*. In some embodiments, the magnitude of the first voltage applied to the plurality of buried conductive lines 134 via the plurality of first lower capacitor contacts 152*a* may be higher than the magnitude of the second voltage applied to the first well 122 via the second lower capacitor contacts 152*b*.

In some embodiments, each of the plurality of first lower capacitor contacts 152*a* and the plurality of second lower capacitor contacts 152*b* may be formed of and/or include a semiconductor material doped with a dopant, a metal, a conductive metal nitride, or a combination thereof. For example, each of the plurality of first lower capacitor contacts 152*a* and the plurality of second lower capacitor contacts 152*b* may be formed of and/or include metals, such as ruthenium (Ru), titanium (Ti), tantalum (Ta), niobium (Nb), iridium (Ir), molybdenum (Mo), and tungsten (W), conductive metal nitrides, such as a titanium nitride (TiN), a tantalum nitride (TaN), a niobium nitride (NbN), a molybdenum nitride (MoN), and a tungsten nitride (WN), a doped polysilicon film, an epitaxially grown silicon film, or a combination thereof.

According to some embodiments, the plurality of first lower capacitor contacts 152*a* may be respectively connected to respective first conductive pads 172*a* that are disposed on respective first lower capacitor contacts 152*a*. In some embodiments, the plurality of first conductive pads 172*a* may have line shapes (e.g., shapes extending lengthwise) that may be parallel to each other, extend in the first horizontal direction (X direction), and be spaced apart from each other with a second interlayer insulating layer 162 therebetween. For example, the second interlayer insulating layer 162 may be disposed on the first interlayer insulating layer 142 and may cover side surfaces of the plurality of first conductive pads 172*a*, and the plurality of first conductive pads 172*a* may be insulated from each other by the second interlayer insulating layer 162.

According to some embodiments, each of the plurality of second lower capacitor contacts 152*b* may be respectively connected to a second conductive pad 172*b* that is disposed on respective second lower capacitor contacts 152*b*. In some embodiments, the second conductive pad 172*b* may have a line shape (e.g., shape extending lengthwise). The second conductive pad 172*b* may be spaced apart from the plurality of first conductive pads 172*a* in the second horizontal direction (Y direction) and extend in the first horizontal direction (X direction). In some embodiments, the second conductive pad 172*b* may be at the same vertical level as the plurality of first conductive pads 172*a* and spaced apart from the plurality of first conductive pads 172*a* with the second interlayer insulating layer 162 therebetween.

In some embodiments, each of the plurality of first conductive pads 172*a* and the second conductive pad 172*b* may be formed of and/or include a semiconductor material doped with a dopant, a metal, a conductive metal nitride, or a combination thereof. For example, each of the plurality of first conductive pads 172*a* and the second conductive pad 172*b* may include metals, such as ruthenium (Ru), titanium (Ti), tantalum (Ta), niobium (Nb), iridium (Ir), molybdenum (Mo), and tungsten (W), conductive metal nitrides, such as a titanium nitride (TiN), a tantalum nitride (TaN), a niobium nitride (NbN), a molybdenum nitride (MoN), and a tungsten nitride (WN), a doped polysilicon film, an epitaxially grown silicon film, or a combination thereof.

In some embodiments, the second interlayer insulating layer 162 may be formed of and/or include a silicon oxide film, a silicon nitride film, a silicon oxynitride film, or a combination thereof, but embodiments are not limited thereto.

In some embodiments, each of the plurality of buried conductive lines 134 may be connected to one first conductive pad 172*a* via one first lower capacitor contact 152*a*, and the magnitudes of voltages applied to the plurality of buried conductive lines 134 may be different between different buried conductive lines 134. In this case, the magnitude of the voltage applied to each of the plurality of buried conductive lines 134 may be different from the magnitude of the voltage applied to the first well 122. In some embodiments, the magnitudes of the voltages applied to the plurality of buried conductive lines 134 may be equal to each other. In this case, the magnitude of the voltage applied to the plurality of buried conductive lines 134 may be different from the magnitude of the voltage applied to the first well 122.

FIG. 3B illustrates that the plurality of first lower capacitor contacts 152*a* are each connected to different first conductive pads 172*a*, and the plurality of second lower capacitor contacts 152*b* are each connected to a single second conductive pad 172*b*. However, embodiments are not limited thereto. For example, although not illustrated, the plurality of first lower capacitor contacts 152*a* may be connected to a single first conductive pad 172*a* that extends in the second horizontal direction (Y direction). For example, the integrated circuit device 10 may include a plurality of second conductive pads 172*b*, and the plurality of second conductive pads 172*b* may be respectively connected to the plurality of second lower capacitor contacts 152*b*.

The integrated circuit device 10 according to some embodiments may include a buried capacitor structure BCS that includes the plurality of buried conductive lines 134, the first well 122, and the lower capacitor dielectric films 132 between the plurality of buried conductive lines 134 and the first well 122. Accordingly, the plurality of buried conductive lines 134 arranged in the peripheral circuit region PA may not only improve the distribution characteristics of a word line formation process in the memory cell region MCA but may be used as capacitors to improve the degree of integration and space utilization of the integrated circuit device 10. In an integrated circuit device according to the comparative example that does not include buried conductive lines 134, structural imbalance occurs between the memory cell region MCA and the peripheral circuit region PA. In the comparative integrated circuit device, the distribution characteristics of a metal etch back process for forming the word lines WL, particularly some word lines WL located at the border of the memory cell region MCA, is deteriorated.

Figure 4:
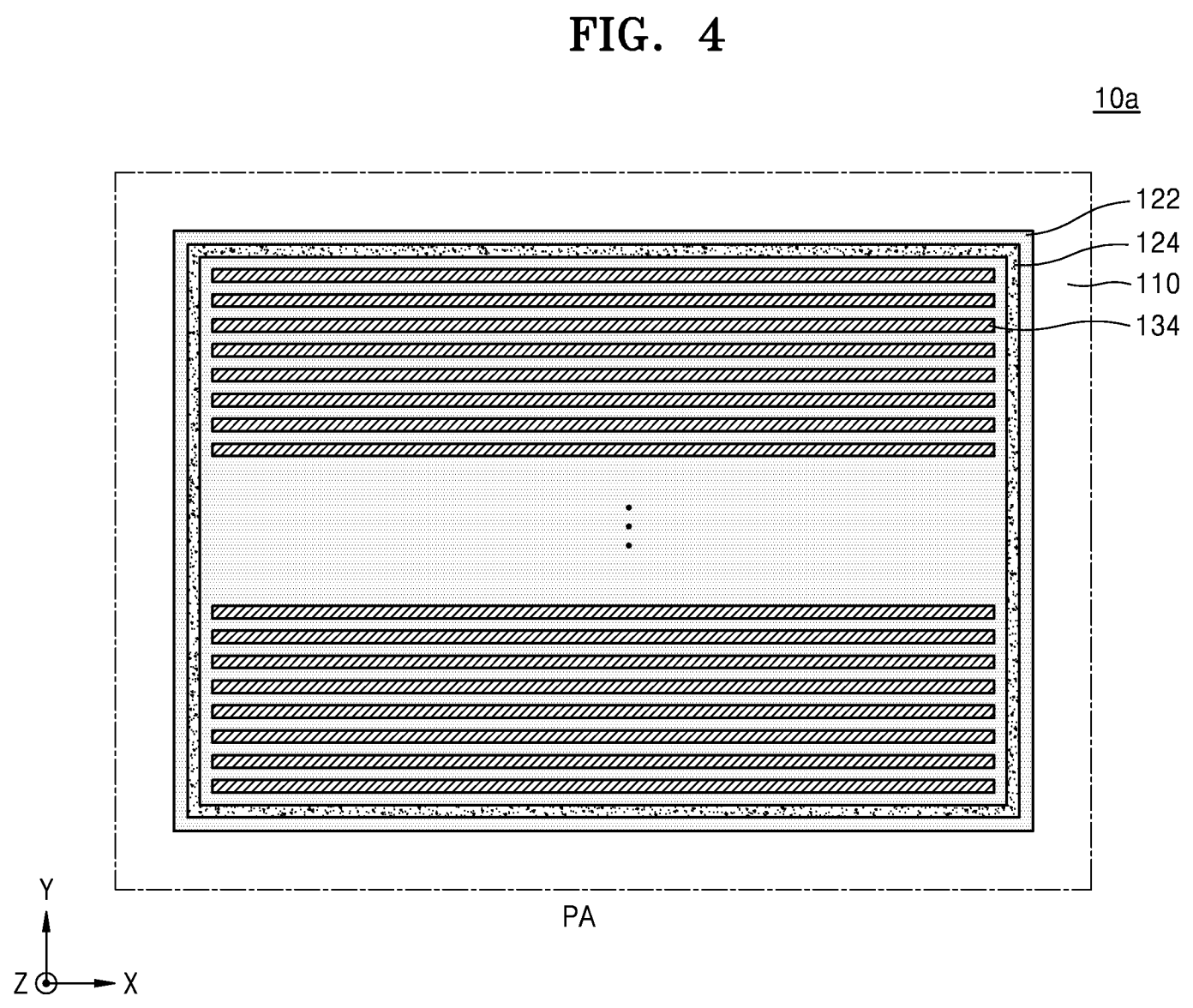

FIG. 4 is a schematic plan layout for describing some components of a peripheral circuit region PA of an integrated circuit device 10*a* according to some embodiments. In the embodiment of FIG. 4 the second well 124 horizontally surrounds a plurality of buried conductive lines 134 as shown in the plan view of FIG. 4.

According to some embodiments, the second well 124 may have a wrap around-type structure that horizontally surrounds the plurality of buried conductive lines 134 as is shown in the plan view of FIG. 4. In this case, the second well 124 may be spaced apart from the plurality of buried conductive lines 134 in the horizontal direction (X direction and/or Y direction), and a portion of a first well 122 may be between the second well 124 and the plurality of buried conductive lines 134. Although not illustrated, a plurality of second lower capacitor contacts 152*b* may be arranged above the second well 124 in a direction in which the second well 124 extends (e.g., may have an overlapping portion above the second well).

Figure 5A:
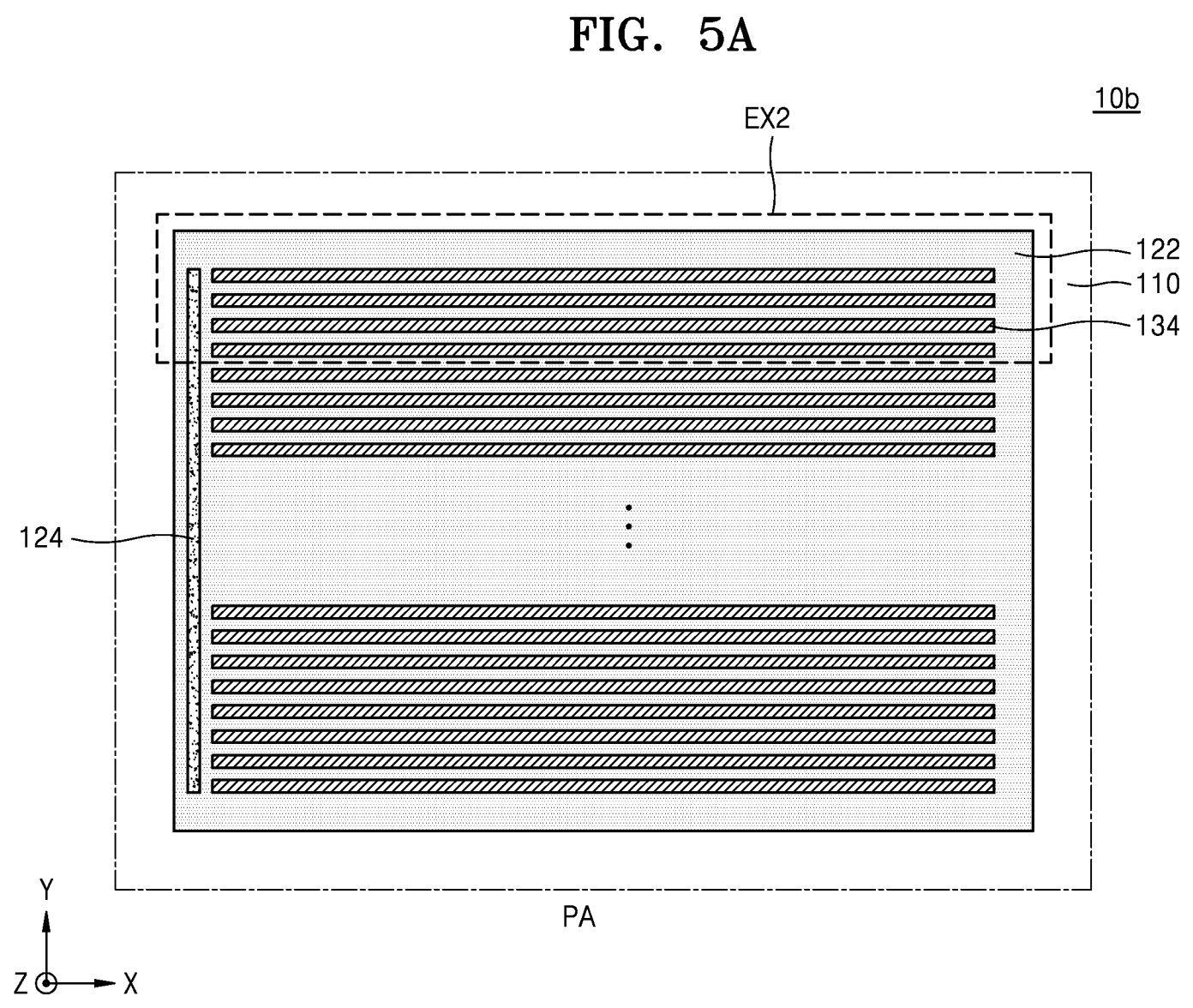
Figure 5B:
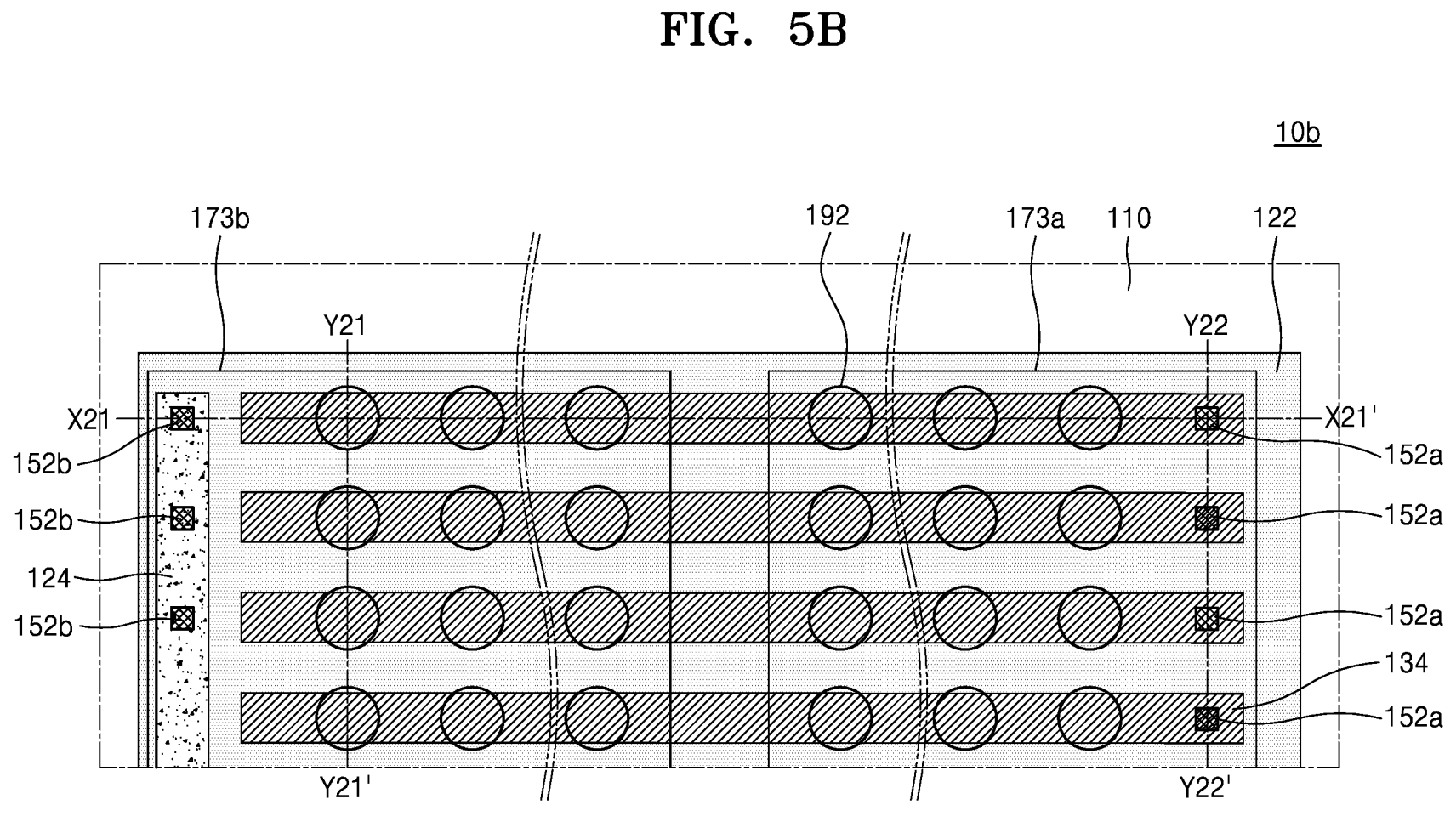
Figure 5C:
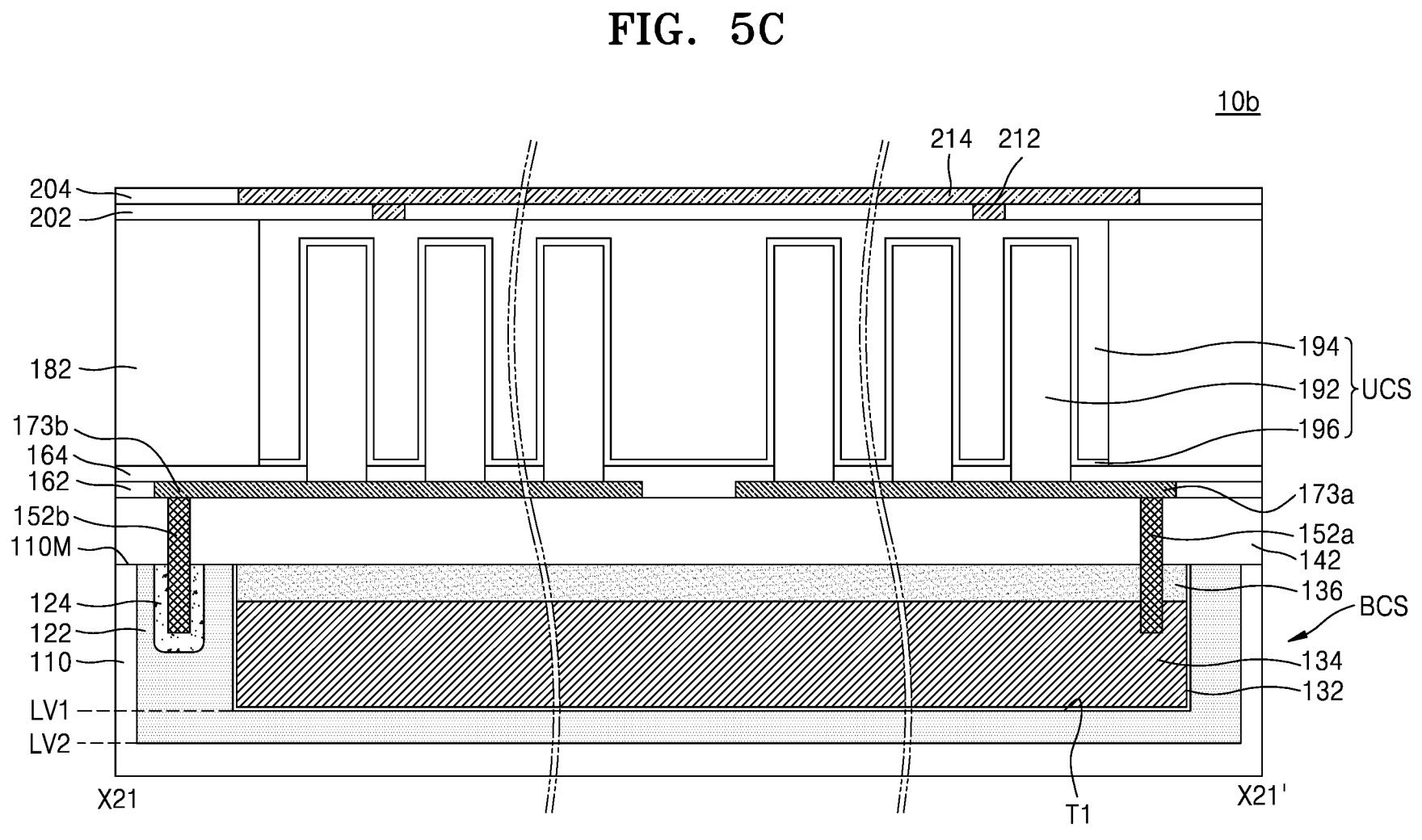
Figure 5D:
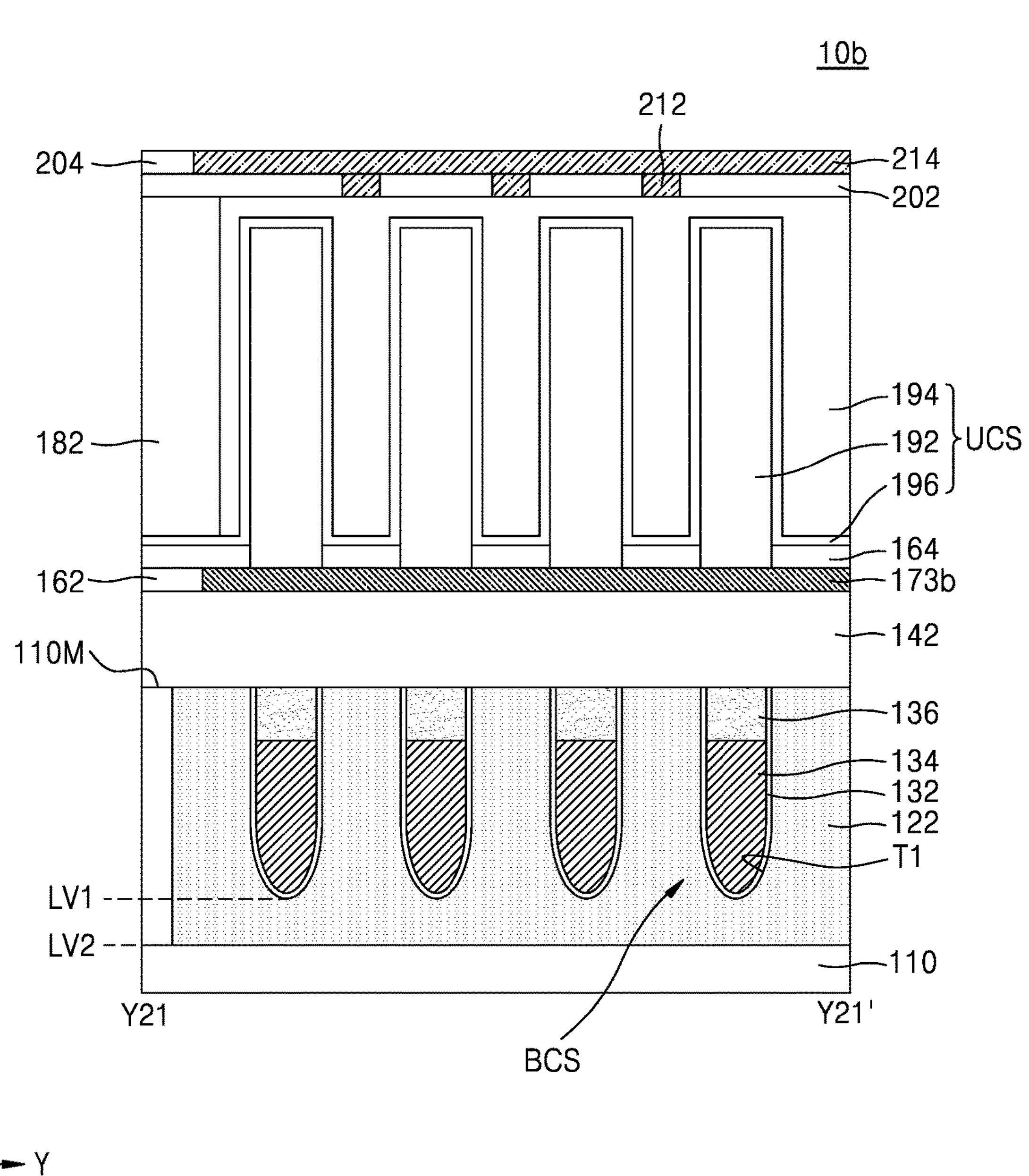
FIG. 5D is a cross-sectional view taken along line Y21-Y21' of FIG. 5B.
Figure 5E:
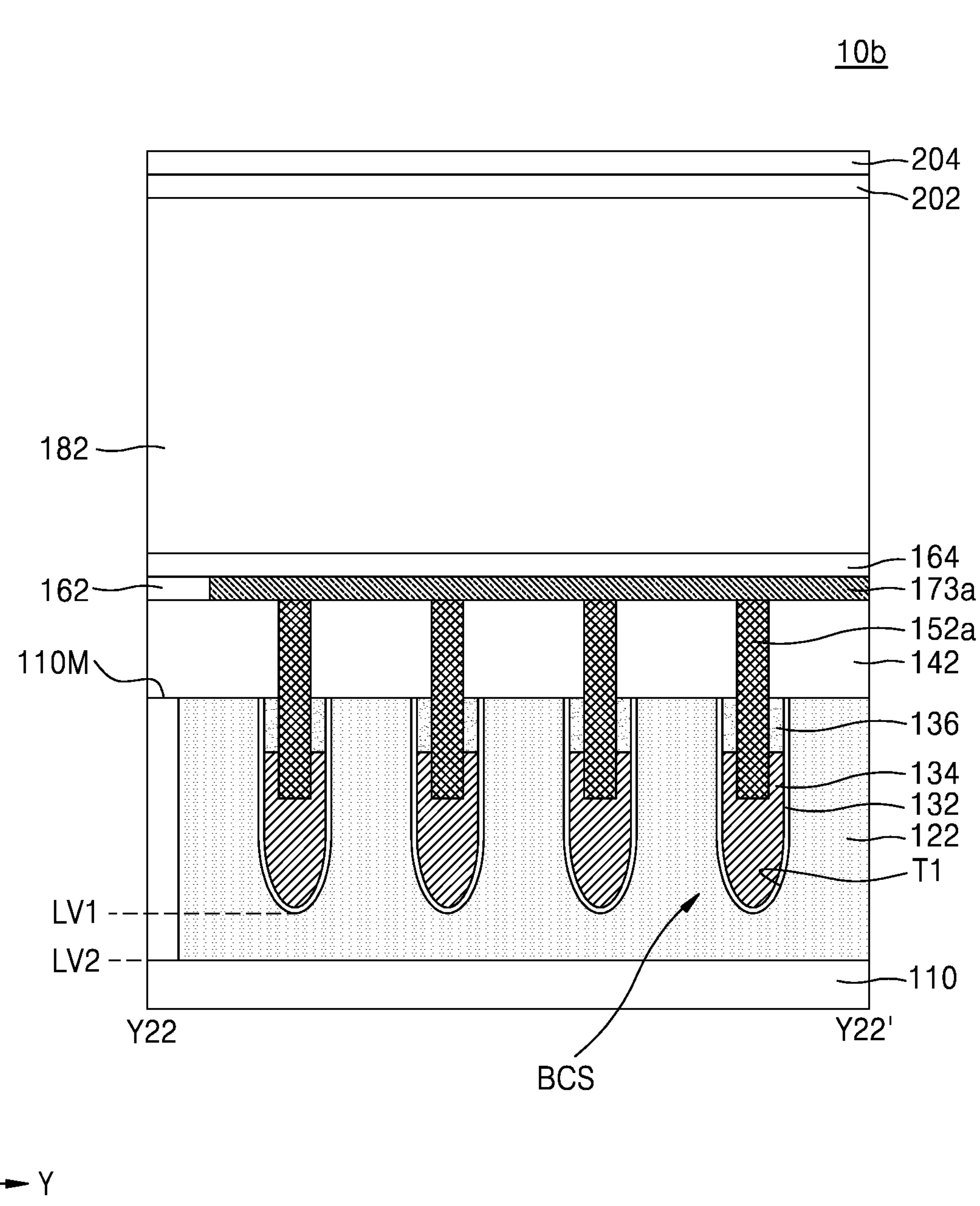
FIG. 5E is a cross-sectional view taken along line Y22-Y22' of FIG. 5B.

FIG. 5A is a schematic plan layout for describing some components of a peripheral circuit region PA of an integrated circuit device 10*b* according to some embodiments. FIG. 5B is an enlarged view of region "EX2" of FIG. 5A. FIG. 5C is a cross-sectional view taken along line X21-X21' of FIG. 5B, FIG. 5D is a cross-sectional view taken along line Y21-Y21' of FIG. 5B, and FIG. 5E is a cross-sectional view taken along line Y22-Y22' of FIG. 5B. In FIGS. 5A to 5E, the same reference numerals as those in FIGS. 3A to 3C are given to the same or similar elements, and repeated descriptions thereof may be omitted here. However, when an element similar to, or the same as a previously described element includes a difference in the structure, arrangement relationship, etc. of the same member, further description of the element may be provided.

In FIGS. 5A to 5E, a second well 124 may extend in a second horizontal direction (Y direction) at a position spaced apart from a plurality of buried conductive lines 134 in a first horizontal direction (X direction). A plurality of second lower capacitor contacts 152*b* may be arranged in the direction in which the second well 124 extends (e.g., the Y direction) and may be in contact with the second well 124.

For example, a first end of the plurality of buried conductive lines 134 in the first horizontal direction (X direction) may be spaced apart from the second well 124 in the first horizontal direction (X direction). A plurality of first lower capacitor contacts 152*a* may be respectively connected to the plurality of buried conductive lines 134 near a second end (e.g., the end opposite the first end in the first horizontal direction) of the plurality of buried conductive lines 134.

According to some embodiments, the integrated circuit device 10*b* may include a first conductive pad 173*a* and a second conductive pad 173*b* which have plate shapes and are disposed on the upper surface of a first interlayer insulating layer 142. The first conductive pad 173*a* and the second conductive pad 173*b* of the integrated circuit device 10*b* may have a larger planar area (e.g., surface area in the horizontal plane) than the plurality of first conductive pads 172*a* and the second conductive pad 172*b* of the integrated circuit device 10*a* described above with reference to FIGS. 3A to 3C.

According to some embodiments, each of the first conductive pad 173*a* and the second conductive pad 173*b* may overlap the plurality of buried conductive lines 134 in the vertical direction (Z direction). For example, the first conductive pad 173*a* may cover the upper surfaces of the plurality of first lower capacitor contacts 152*a* and a portion of the upper surface of the first interlayer insulating layer 142 above the plurality of buried conductive lines 134. For example, the second conductive pad 173*b* may cover the upper surfaces of the plurality of second lower capacitor contacts 152*b* and a portion of the upper surface of the first interlayer insulating layer 142 above the plurality of buried conductive lines 134 and the second well 124. According to some embodiments, the first conductive pad 173*a* and the second conductive pad 173*b* may be spaced apart from each other in the first horizontal direction (X direction) with a second interlayer insulating layer 162 therebetween and may be insulated from each other. In some embodiments, the second conductive pad 173*b* may overlap the second well 124 in the vertical direction (Z direction).

For example, the plurality of first lower capacitor contacts 152*a* may be in contact with the lower surface of the first conductive pad 173*a*, and the plurality of buried conductive lines 134 may be electrically connected to the first conductive pad 173*a* via the plurality of first lower capacitor contacts 152*a*. For example, the plurality of second lower capacitor contacts 152*b* may be in contact with the lower surface of the second conductive pad 173*b*, and the first well 122 may be electrically connected to the second conductive pad 173*b* via the second well 124 and the plurality of second lower capacitor contacts 152*b*.

In some embodiments, the second well 124 may be omitted. In this case, the plurality of second lower capacitor contacts 152*b* may be in contact with the first well 122. In this case, the first well 122 may be electrically connected to the second conductive pad 173*b* via the plurality of second lower capacitor contacts 152*b*.

According to some embodiments, a third interlayer insulating layer 164 may be disposed on the first conductive pad 173*a* and the second conductive pad 173*b*. According to some embodiments, the third interlayer insulating layer 164 may cover the upper surface of the first conductive pad 173*a*, the upper surface of the second conductive pad 173*b*, and the upper surface of the second interlayer insulating layer 162. According to some embodiments, the third interlayer insulating layer 164 may include an insulating material having an etch selectivity with respect to the second interlayer insulating layer 162. In some embodiments, the third interlayer insulating layer 164 may include a silicon boron nitride (SiBN) film, a silicon carbon nitride (SiCN) film, a silicon nitride (SiN) film, or a combination thereof. Each of the terms "SiBN," "SiCN," and "SiN" as used herein refers to a material composed of elements included in the term and is not a chemical formula representing a stoichiometric relationship.

According to some embodiments, an upper capacitor structure UCS may be disposed on the first conductive pad 173*a* and the second conductive pad 173*b*. According to some embodiments, the upper capacitor structure UCS may include: a plurality of lower electrodes 192 which extend in the vertical direction (Z direction), pass through the third interlayer insulating layer 164, and each of the lower electrodes come into contact with one of the first conductive pad 173*a* or the second conductive pad 173*b*; an upper electrode 194 which includes portions that horizontally surround portions of the plurality of lower electrodes 192 above the third interlayer insulating layer 164; and an upper capacitor dielectric film 196 between the plurality of lower electrodes 192 and the upper electrode 194.

For example, the plurality of lower electrodes 192 may be spaced apart from each other in the horizontal direction (X direction and/or Y direction) above a buried capacitor structure BCS. For example, the upper capacitor dielectric film 196 may cover a portion of the upper surface of the third interlayer insulating layer 164 and portions of the upper and side surfaces of the plurality of lower electrodes 192. For example, the upper electrode 194 on the upper capacitor dielectric film 196 may cover the plurality of lower electrodes 192, and portions of the side and upper surfaces of the plurality of lower electrodes 192 may face the upper electrode 194 with the upper capacitor dielectric film 196 therebetween. For example, the plurality of lower electrodes 192 may be spaced apart from each other in the horizontal direction (X direction and/or Y direction), and the upper electrode 194 may be between the plurality of lower electrodes 192.

According to some embodiments, a first group of lower electrodes 192 selected from among the plurality of lower electrodes 192 may be connected to the first conductive pad 173*a*, and a second group of lower electrodes 192 selected from among the plurality of lower electrodes 192 may be connected to the second conductive pad 173*b*. FIG. 5C illustrates that the first group of lower electrodes 192 and the second group of lower electrodes 192 are surrounded together by a single upper electrode 194, but embodiments are not limited thereto. For example, the upper electrode 194 may include a first electrode and a second electrode spaced apart from each other. Accordingly, the first electrode may surround the first group of lower electrodes 192, and the second electrode may surround the second group of lower electrodes 192. In this case, an insulating structure may be between the first electrode and the second electrode.

In some embodiments, each of the lower electrodes 192 and the upper electrode 194 may be formed of and/or include at least one material selected from among metals, such as ruthenium (Ru), titanium (Ti), tantalum (Ta), niobium (Nb), iridium (Ir), molybdenum (Mo), and tungsten (W), conductive metal nitrides, such as a titanium nitride (TiN), a tantalum nitride (TaN), a niobium nitride (NbN), a molybdenum nitride (MoN), and a tungsten nitride (WN), conductive metal oxides, such as an iridium oxide ($IrO_2$), a ruthenium oxide ($RuO_2$), and a strontium ruthenium oxide ($SrRuO_3$), doped polysilicon, and a metal silicide, but embodiments are not limited thereto. In some embodiments, the upper capacitor dielectric film 196 may be formed of and/or include at least one material among a zirconium oxide, a hafnium oxide, a titanium oxide, a niobium oxide, a tantalum oxide, an yttrium oxide, a strontium titanium oxide, a barium strontium titanium oxide, a scandium oxide, and a lanthanum oxide, but embodiments are not limited thereto.

According to some embodiments, the buried capacitor structure BCS and the upper capacitor structure UCS of the integrated circuit device 10*b* may be electrically connected to each other via the first conductive pad 173*a* and the second conductive pad 173*b*. For example, the buried capacitor structure BCS and the upper capacitor structure UCS may be connected in parallel in a circuit, and thus, a limited space of the peripheral circuit region PA may be used to achieve a capacitor with improved capacitance.

According to some embodiments, the upper capacitor structure UCS may be surrounded by a molding structure 182 disposed on the third interlayer insulating layer 164. For example, the molding structure 182 may include an insulating film that includes a silicon oxide film, a silicon nitride film, or a combination thereof, but embodiments are not limited thereto.

According to some embodiments, a first upper insulating layer 202 and a second upper insulating layer 204 may be sequentially stacked on the upper electrode 194. For example, the first upper insulating layer 202 may cover the upper surface of the molding structure 182 and the upper surface of the upper electrode 194. In some embodiments, each of the first upper insulating layer 202 and the second upper insulating layer 204 may include an insulating film that includes a silicon oxide film, a silicon nitride film, or a combination thereof, but embodiments are not limited thereto.

According to some embodiments, a plurality of upper contacts 212 may be located on the upper electrode 194, and the upper contacts 212 may pass through the first upper insulating layer 202 and come into contact with the upper surface of the upper electrode 194. For example, the plurality of upper contacts 212 may be spaced apart from each other with the first upper insulating layer 202 therebetween. According to some embodiments, a conductive plate 214 in contact with the upper surfaces the upper contacts 212 may be disposed on the plurality of upper contacts 212, and a side surface of the conductive plate 214 may be covered by the second upper insulating layer 204. For example, the conductive plate 214 may be electrically connected to the upper electrode 194 via the plurality of upper contacts 212.

In some embodiments, the plurality of upper contacts 212 may be formed of and/or include a semiconductor material doped with a dopant, a metal, a conductive metal nitride, or a combination thereof. For example, the plurality of upper contacts 212 may include metals, such as ruthenium (Ru), titanium (Ti), tantalum (Ta), niobium (Nb), iridium (Ir), molybdenum (Mo), and tungsten (W), conductive metal nitrides, such as a titanium nitride (TiN), a tantalum nitride (TaN), a niobium nitride (NbN), a molybdenum nitride (MoN), and a tungsten nitride (WN), a doped polysilicon film, an epitaxially grown silicon film, or a combination thereof.

In some embodiments, the conductive plate 214 may be formed of and/or include a semiconductor material doped with a dopant, a metal, a conductive metal nitride, or a combination thereof.

Figure 6A:
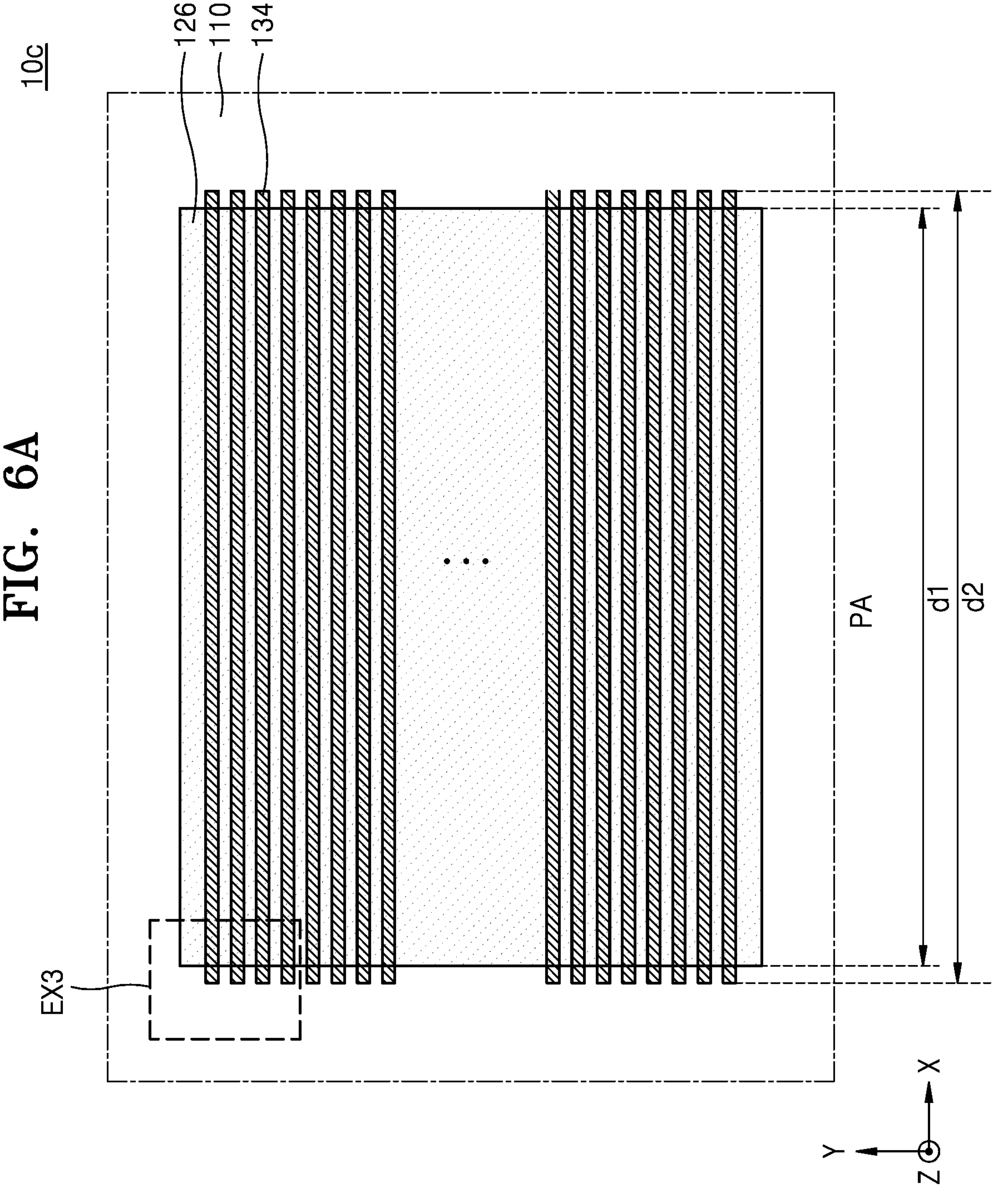
FIG. 6A is a schematic plan layout for describing some components of a peripheral circuit region of an integrated circuit device according to some embodiments.
Figure 6B:
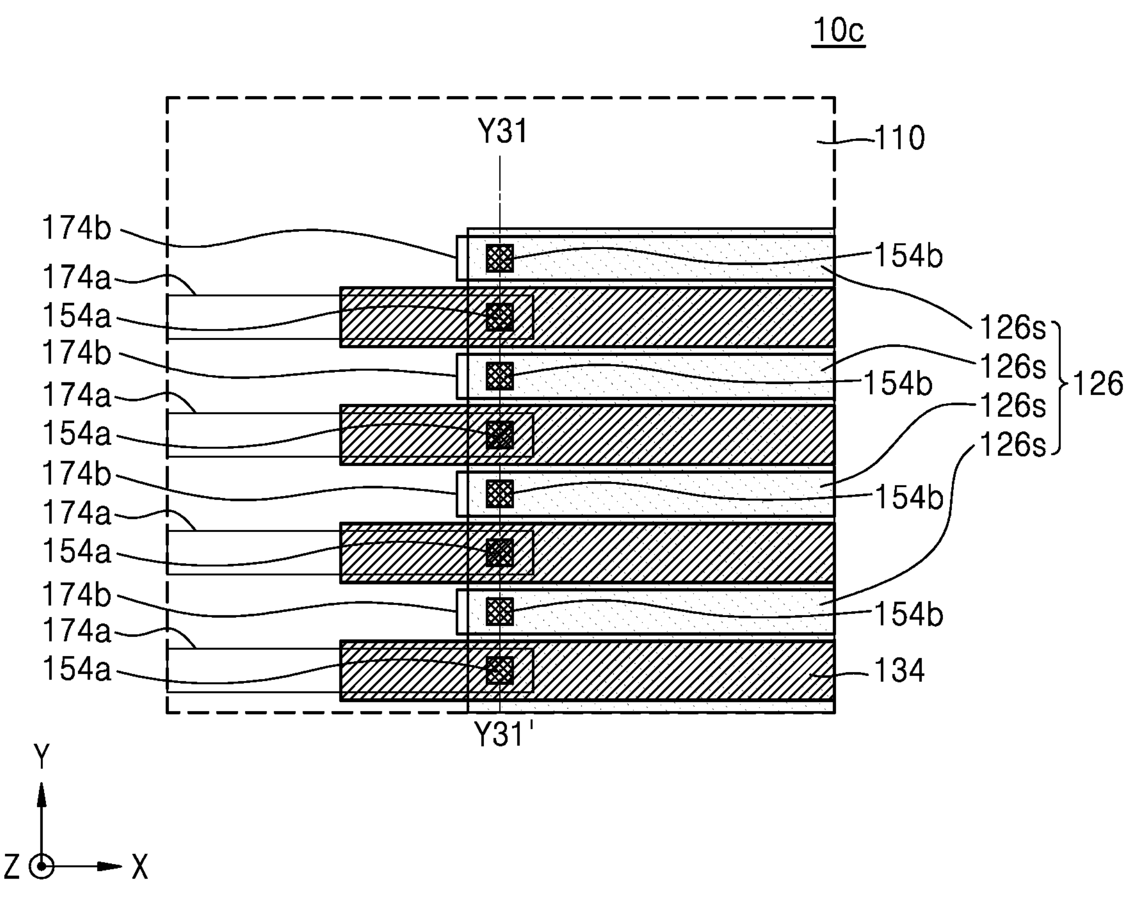
FIG. 6B is an enlarged view of region "EX3" of FIG. 6A.
Figure 6C:
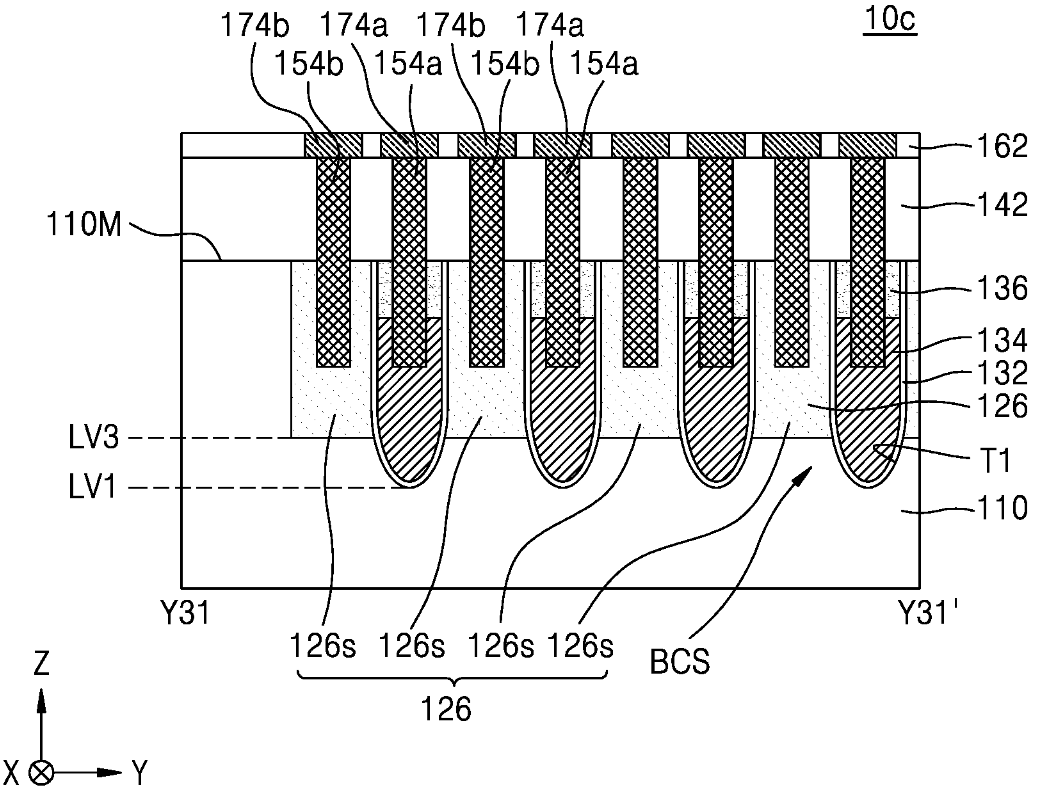
FIG. 6C is a cross-sectional view taken along line Y31-Y31' of FIG. 6B.

FIG. 6A is a schematic plan layout for describing some components of a peripheral circuit region PA of an integrated circuit device 10*c* according to some embodiments. FIG. 6B is an enlarged view of region "EX3" of FIG. 6A. FIG. 6C is a cross-sectional view taken along line Y31-Y31' of FIG. 6B. In FIGS. 6A to 6C, the same reference numerals as those in FIGS. 3A to 3C are given to the same or similar elements, and repeated descriptions thereof may be omitted here. However, when an element similar to, or the same as a previously described element includes a difference in the structure, arrangement relationship, etc. of the same member, further description of the element may be provided. In the integrated circuit device 10*c* of FIGS. 6A to 6C, the integrated circuit device 10*c* includes a third well 126 which may be in place of, or in addition to the second well 124.

Referring to FIGS. 6A to 6C, the integrated circuit device 10*c* may include the third well 126 located inside the substrate 110. According to some embodiments, the third well 126, which may be provided as a part of the substrate 110, may include an ion implantation region doped with a dopant and may be located in an upper portion of the substrate 110 that is exposed from the main surface 110M of the substrate 110. In some embodiments, the third well 126 may include a semiconductor layer doped with a p-type dopant. For example, the p-type dopant may include boron (B) or gallium (Ga). In some embodiments, the third well 126 may include a semiconductor layer doped with an n-type dopant. For example, the n-type dopant may include phosphorus (P), arsenic (As), or antimony (Sb). For example, the substrate 110 may include a p-type semiconductor substrate, and the third well 126 may have n-type characteristics.

According to some embodiments, a plurality of line trenches T1 extend parallel to each other, pass through the third well 126 in a vertical direction (Z direction), and cross the third well 126 in a first horizontal direction (X direction). A buried conductive line 134 of the plurality of buried conductive lines 134 may be located inside a line trench T1 of the plurality of line trenches T1. According to some embodiments, the bottom surfaces of the plurality of line trenches T1 may be at a first vertical level LV1, and the bottom surface of the third well 126 may be at a third vertical level LV3 that is higher than the first vertical level LV1. In some embodiments, the plurality of buried conductive lines 134 may include portions that extend into the substrate 110 in the vertical direction (Z direction). For example, the plurality of buried conductive lines 134 may include portions that protrude from the bottom surface of the third well 126 into the substrate 110. For example, lower portions of the plurality of buried conductive lines 134 may be surrounded by the substrate 110. In some embodiments, the bottom surface of the third well 126 may be at the first vertical level LV1.

In some embodiments, the plurality of buried conductive lines 134 may cross the third well 126 and extend in the first horizontal direction (X direction). In some embodiments, a width of the third well 126 in the first horizontal direction (X direction) may have a first length d1, and a length of each of the plurality of buried conductive lines 134 in the first horizontal direction (X direction) may have a second length d2 that is greater than the first length d1. In some embodiments, both ends of each of the plurality of buried conductive lines 134 in the first horizontal direction (X direction) may include protruding portions that extend from the boundary of the third well 126 in the first horizontal direction (X direction) as shown in a plan view. In some embodiments, the first length d1 may be equal to the second length d2.

According to some embodiments, the third well 126 may include a plurality of sub wells 126*s* that are spaced apart from each other in a second horizontal direction (Y direction) by the plurality of line trenches T1. In some embodiments, the plurality of sub wells 126*s* may be parallel to each other and extend in the first horizontal direction (X direction) and may be spaced apart from each other in the second horizontal direction (Y direction) with a buried conductive line 134 of the buried conductive lines 134 therebetween. In some embodiments, one buried conductive line 134 may be between a pair of sub wells 126*s* adjacent to each other in the second horizontal direction (Y direction) among the plurality of sub wells 126*s*, and each of the plurality of buried conductive lines 134 may face a respective pair of sub wells 126*s* at both sides of the corresponding buried conductive line 134 in the second horizontal direction (Y direction) with a lower capacitor dielectric film 132 therebetween.

According to some embodiments, a plurality of first lower capacitor contacts 154*a* are respectively arranged above the plurality of buried conductive lines 134. The first lower capacitor contacts 154*a* may pass through a first interlayer insulating layer 142 and a plurality of capping insulating films 136 in the vertical direction (Z direction) and respectively come into contact with the plurality of buried conductive lines 134. In some embodiments, the plurality of first lower capacitor contacts 154*a* may respectively pass through the upper surfaces of the plurality of buried conductive lines 134 and partially extend into the plurality of buried conductive lines 134.

According to some embodiments, a plurality of second lower capacitor contacts 154*b* are respectively arranged above the plurality of sub wells 126*s*. The plurality of second lower capacitor contacts 154*b* may pass through the first interlayer insulating layer 142 in the vertical direction (Z direction) and respectively come into contact with the plurality of sub wells 126*s*. In some embodiments, the plurality of second lower capacitor contacts 154*b* may partially pass through the plurality of sub wells 126*s*, and portions of the plurality of second lower capacitor contacts 154*b* may extend into the plurality of sub wells 126*s*.

In some embodiments, the magnitude of a voltage applied to the plurality of buried conductive lines 134 via the plurality of first lower capacitor contacts 154*a* may be different from the magnitude of a voltage applied to the plurality of sub wells 126*s* via the second lower capacitor contacts 154*b*. A buried capacitor structure BCS of the integrated circuit device 10*c* may include the plurality of sub wells 126*s*, the plurality of buried conductive lines 134, and the plurality of lower capacitor dielectric films 132.

According to some embodiments, a plurality of first conductive pads 174*a* may be disposed on the plurality of first lower capacitor contacts 154*a*, and a plurality of second conductive pads 174*b* may be disposed on the plurality of second lower capacitor contacts 154*b*. For example, each of the plurality of first conductive pads 174*a* and the plurality of second conductive pads 174*b* may have a line shape.

According to some embodiments, the plurality of first conductive pads 174*a* and the plurality of second conductive pads 174*b* may each extend in the first horizontal direction (X direction) on the first interlayer insulating layer 142 and may be alternately arranged in the second horizontal direction (Y direction).

Figure 7:
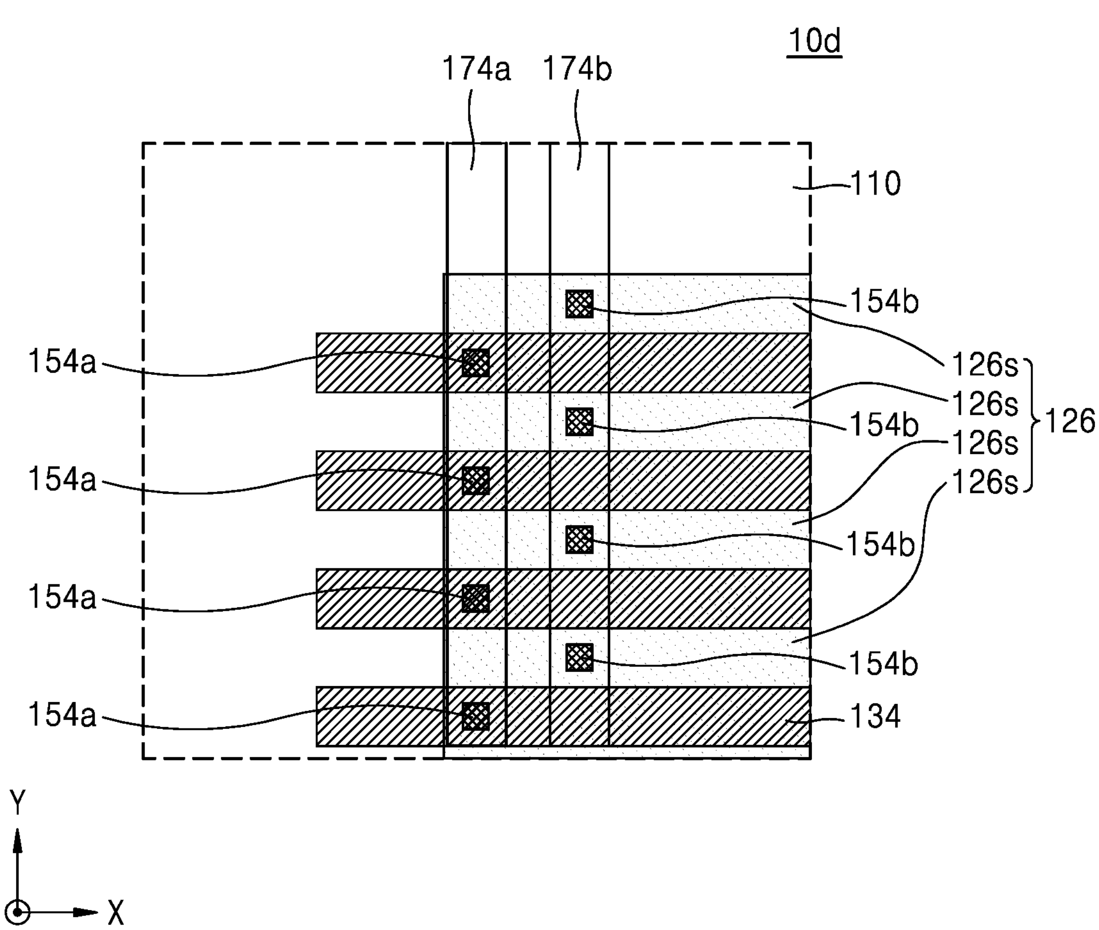
FIG. 7 is a schematic plan layout for describing some components of a peripheral circuit region of an integrated circuit device according to some embodiments and shows a region corresponding to FIG. 6B.

FIG. 7 is a schematic plan layout for describing some components of a peripheral circuit region PA of an integrated circuit device 10*d* according to some embodiments and shows a region corresponding to FIG. 6B. In FIG. 7 a plurality of first lower capacitor contacts 154*a* are connected to a single first conductive pad 174*a*, and a plurality of second lower capacitor contacts 154*b* are connected to a single second conductive pad 174*b*.

Referring to FIG. 7, the plurality of first lower capacitor contacts 154*a* may be connected to the single first conductive pad 174*a* that extends in a second horizontal direction (Y direction) on the plurality of first lower capacitor contacts 154*a*. For example, the plurality of first lower capacitor contacts 154*a* may be arranged in a line in the second horizontal direction (Y direction) respectively on a plurality of buried conductive lines 134 and may be connected to the single first conductive pad 174*a* together.

According to some embodiments, the plurality of second lower capacitor contacts 154*b* may be connected to the single second conductive pad 174*b* that extends in the second horizontal direction (Y direction) on the plurality of second lower capacitor contacts 154*b*. For example, the plurality of second lower capacitor contacts 154*b* may be arranged in a line in the second horizontal direction (Y direction) respectively on a plurality of sub wells 126*s* and may be connected to the single second conductive pad 174*b* together.

In some embodiments, the first conductive pad 174*a* and the second conductive pad 174*b* may be spaced apart from each other in the first horizontal direction (X direction) and extend side by side in the second horizontal direction (Y direction). In some embodiments, the plurality of first lower capacitor contacts 154*a* and the plurality of second lower capacitor contacts 154*b* may be arranged offset from each other in the first horizontal direction (X direction) and the second horizontal direction (Y direction) as visible when viewed in a plan view.

FIG. 7 illustrates that the plurality of first lower capacitor contacts 154*a* are connected to the single first conductive pad 174*a*, and the plurality of second lower capacitor contacts 154*b* are connected to the single second conductive pad 174*b*. However, the inventive concept is not limited thereto. According to some embodiments, the plurality of first lower capacitor contacts 154*a* may be connected to the single first conductive pad 174*a*, but the plurality of second lower capacitor contacts 154*b* may be individually connected to a plurality of second conductive pads 174*b*.

Figure 8A:
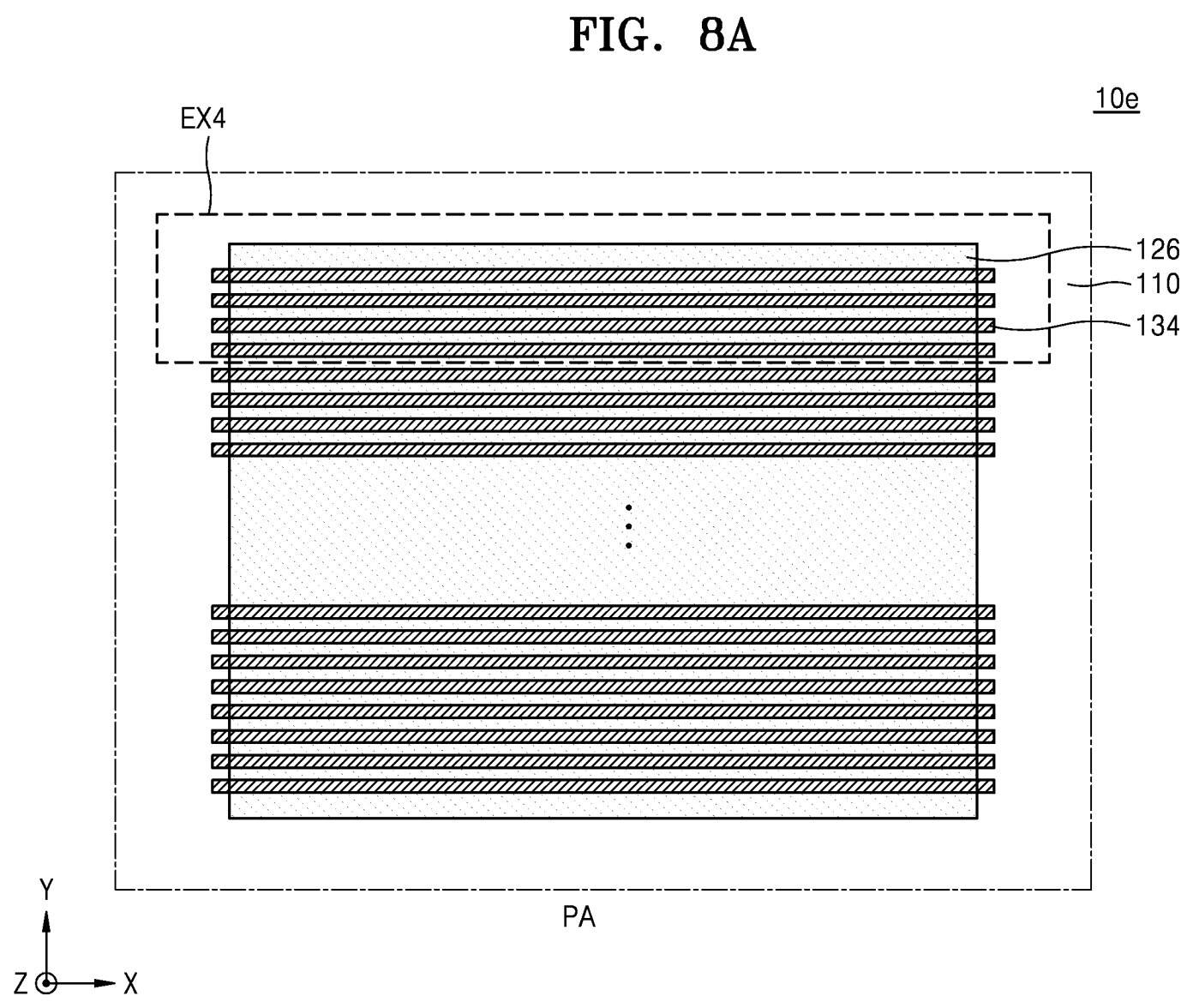
Figure 8B:
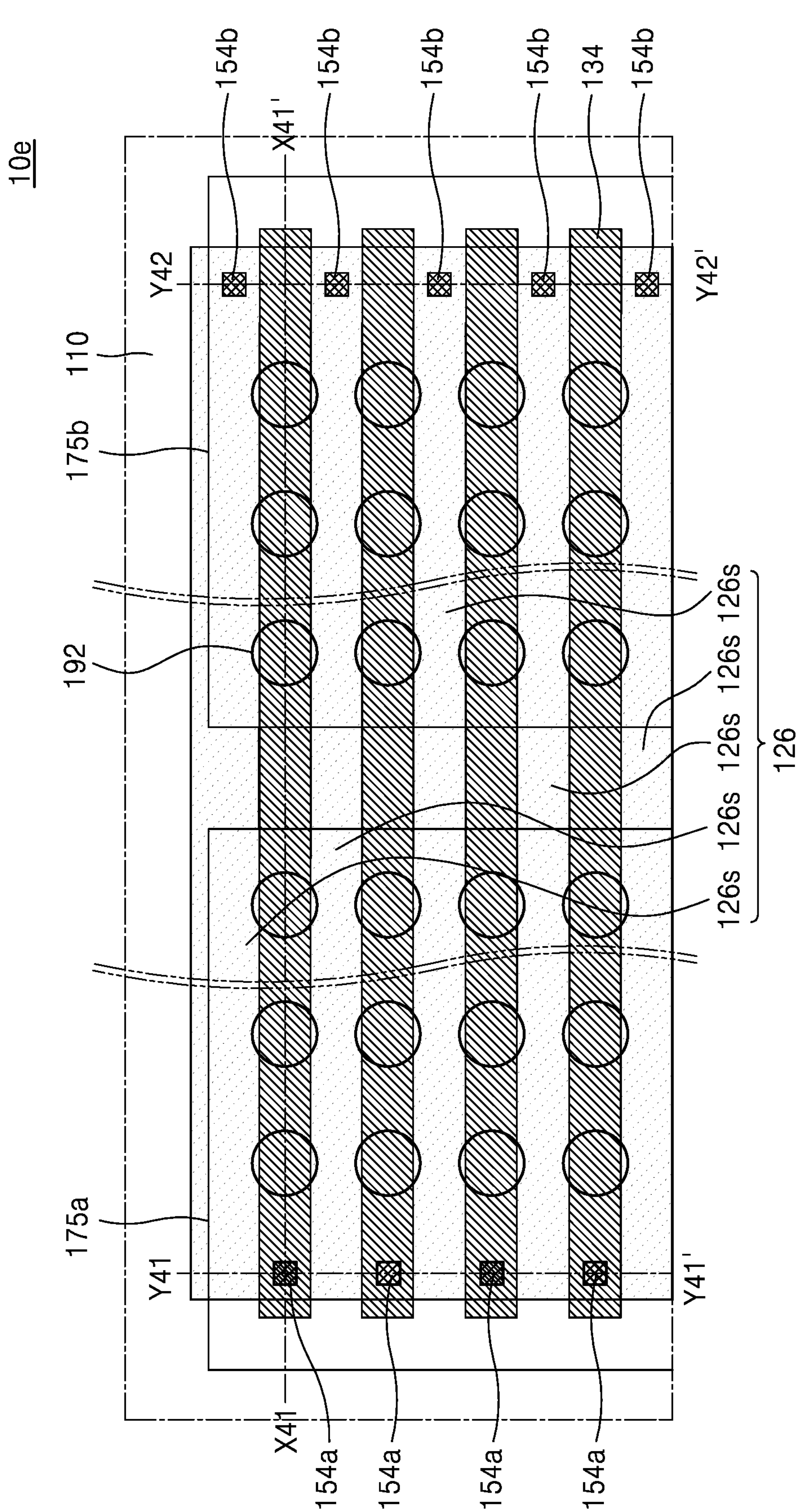
FIG. 8B is an enlarged view of region "EX4" of FIG. 8A.
Figure 8C:
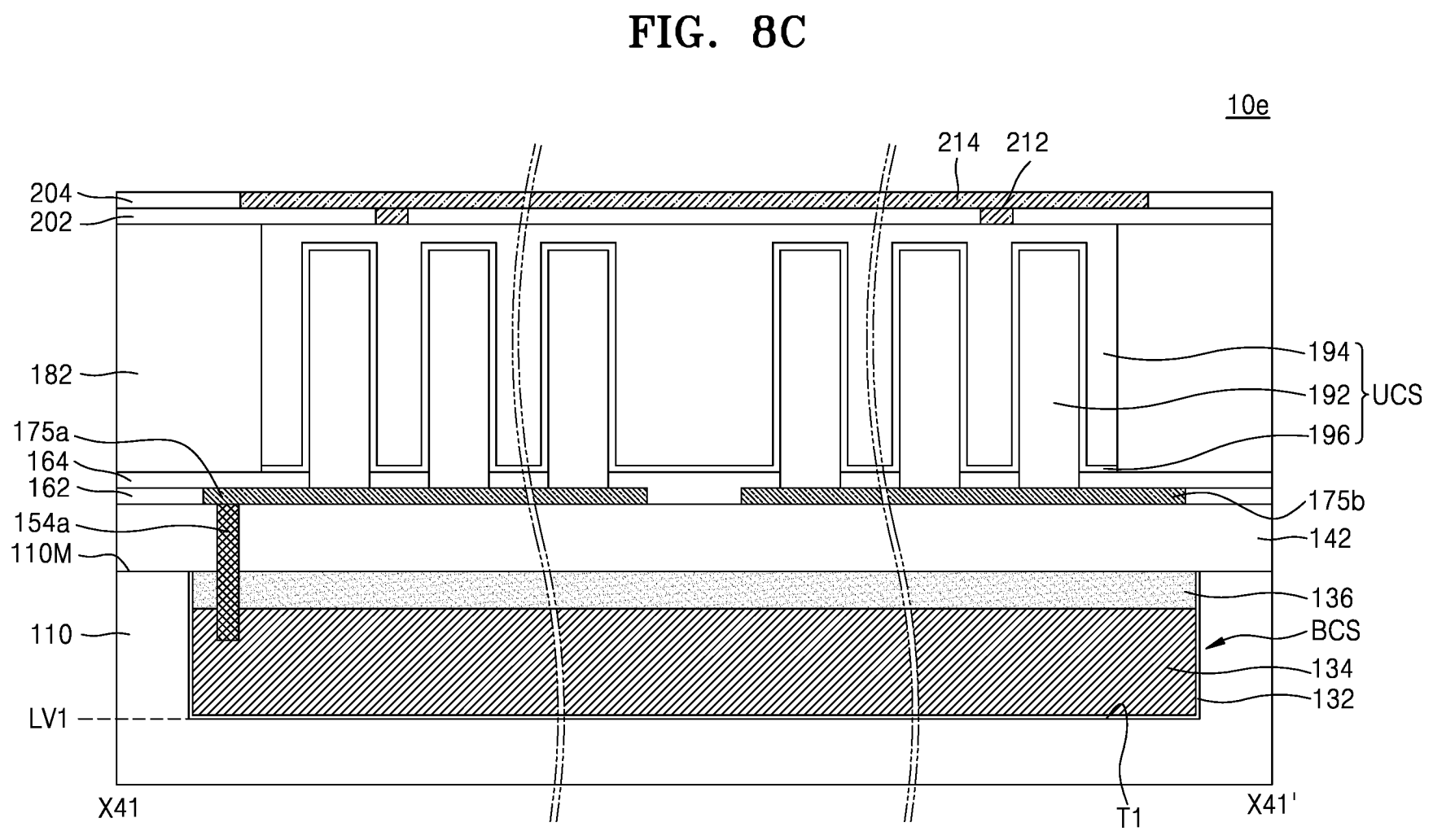
Figure 8D:
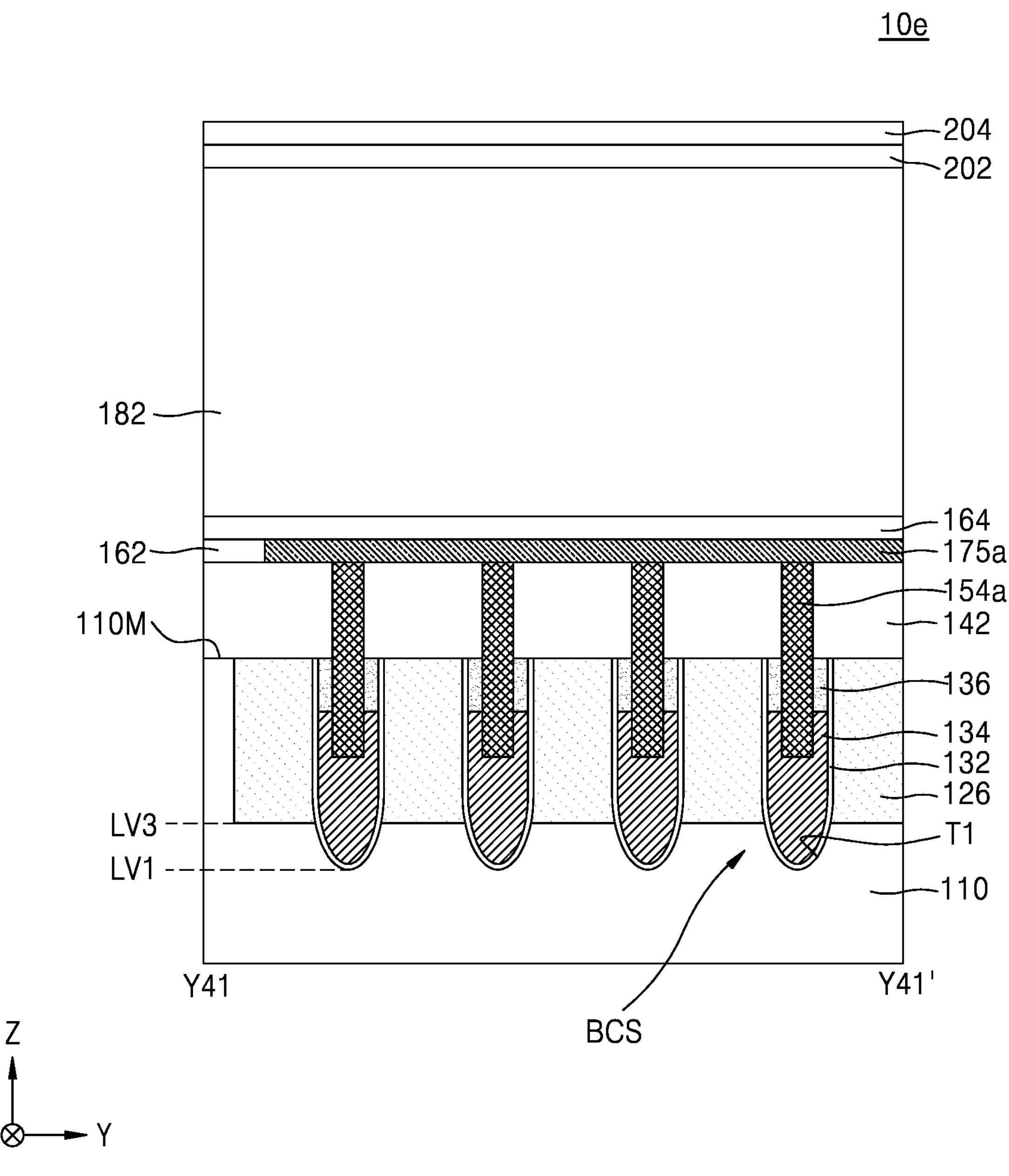
FIG. 8D is a cross-sectional view taken along line Y41-Y41' of FIG. 8B.
Figure 8E:
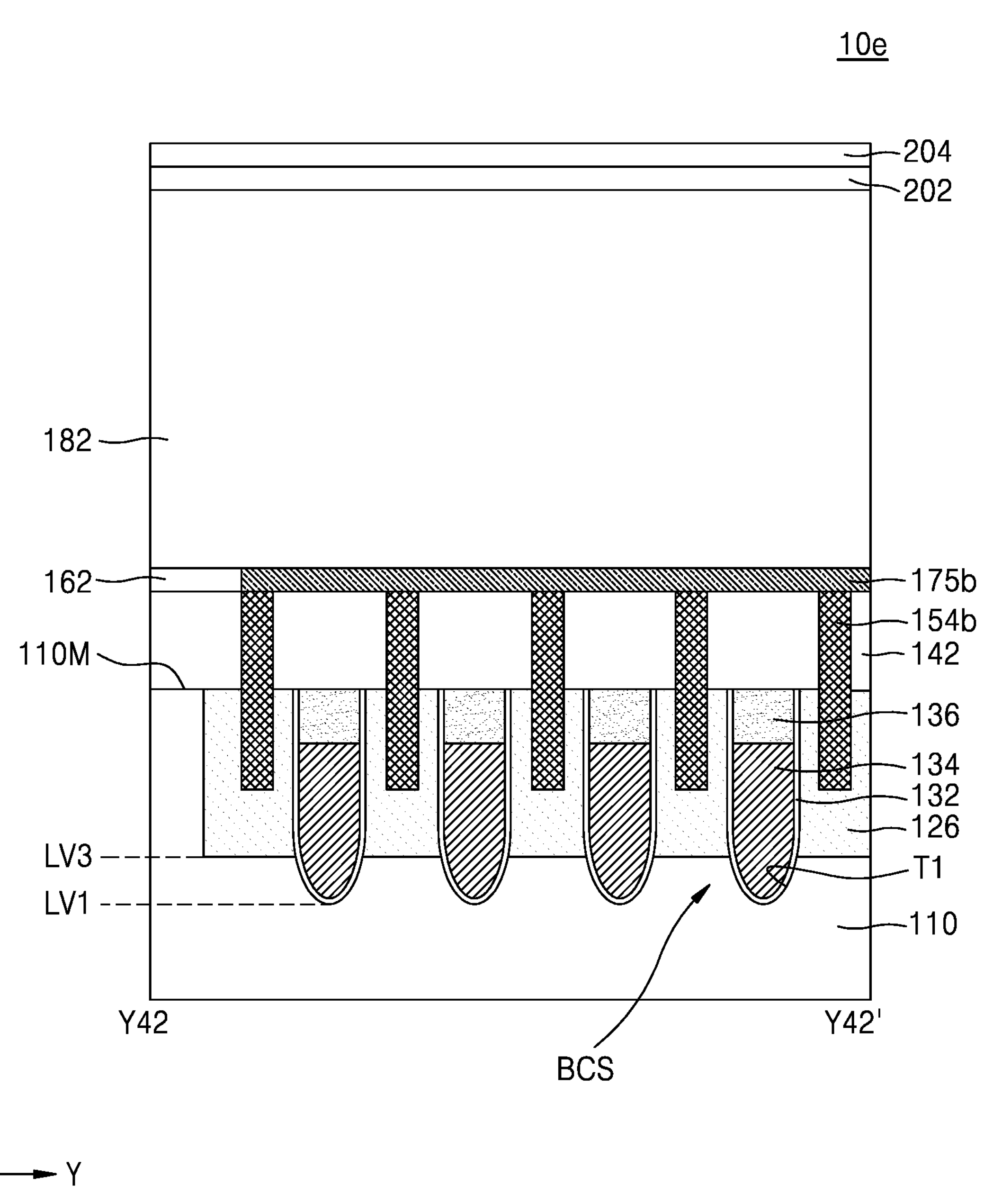
FIG. 8E is a cross-sectional view taken along line Y42-Y42' of FIG. 8B.

FIG. 8A is a schematic plan layout for describing some components of a peripheral circuit region PA of an integrated circuit device 10*e* according to some embodiments. FIG. 8B is an enlarged view of region "EX4" of FIG. 8A. FIG. 8C is a cross-sectional view taken along line X41-X41' of FIG. 8B, FIG. 8D is a cross-sectional view taken along line Y41-Y41' of FIG. 8B, and FIG. 8E is a cross-sectional view taken along line Y42-Y42' of FIG. 8B. In FIGS. 8A to 8E, the same reference numerals as those in FIGS. 6A to 6C and FIGS. 5A to 5E are given to the same or similar elements, and repeated descriptions thereof may be omitted. However, when an element similar to, or the same as a previously described element includes a difference in the structure, arrangement relationship, etc. of the same member, further description of the element may be provided.

Referring to FIGS. 8A to 8E, a plurality of first lower capacitor contacts 154*a* and a plurality of second lower capacitor contacts 154*b* may be spaced apart from each other in a first horizontal direction (X direction). According to some embodiments, the plurality of first lower capacitor contacts 154*a* may be respectively disposed on a first end, in the first horizontal direction (X direction), of a respective buried conductive line of the plurality of buried conductive lines 134 and may be in contact with the plurality of buried conductive lines 134. According to some embodiments, the plurality of second lower capacitor contacts 154*b* may be respectively disposed on a respective sub well 126 of the plurality of sub wells 126*s* near a second end (e.g., the opposite end) of the buried conductive lines 134 and may be in contact with the plurality of sub wells 126*s*.

According to some embodiments, a first conductive pad 175*a* may be disposed on the plurality of first lower capacitor contacts 154*a* to cover both the upper surfaces of the plurality of first lower capacitor contacts 154*a* and a portion of the upper surface of a first interlayer insulating layer 142. According to some embodiments, a second conductive pad 175*b* may be disposed on the plurality of second lower capacitor contacts 154*b* to cover both the upper surfaces of the plurality of second lower capacitor contacts 154*b* and a portion of the upper surface of the first interlayer insulating layer 142. According to some embodiments, the first conductive pad 175*a* and the second conductive pad 175*b* may be spaced apart from each other in the first horizontal direction (X direction) with a second interlayer insulating layer 162 therebetween and may be insulated from each other.

According to some embodiments, the first conductive pad 175*a* and the second conductive pad 175*b* may have plate shapes, and the planar areas thereof may be larger than those of the plurality of first conductive pads 174*a* and the plurality of second conductive pad 174*b*, respectively, of the integrated circuit device 10*c* described above with reference to FIGS. 6A to 6C. In some embodiments, each of the first conductive pad 175*a* and the second conductive pad 175*b* on the first interlayer insulating layer 142 may overlap both the plurality of buried conductive lines 134 and the plurality of sub wells 126*s*.

For example, the plurality of first lower capacitor contacts 154*a* may be in contact with the lower surface of the first conductive pad 175*a*, and the plurality of buried conductive lines 134 may be electrically connected to the first conductive pad 175*a* via the plurality of first lower capacitor contacts 154*a*. For example, the plurality of second lower capacitor contacts 154*b* may be in contact with the lower surface of the second conductive pad 175*b*, and the plurality of sub wells 126*s* may be electrically connected to the second conductive pad 175*b* via the plurality of second lower capacitor contacts 154*b*.

According to some embodiments, an upper capacitor structure UCS may be disposed on the first conductive pad 175*a* and the second conductive pad 175*b*. According to some embodiments, a first group of lower electrodes 192 selected from among a plurality of lower electrodes 192 may pass through a third interlayer insulating layer 164 and come into contact with the upper surface of the first conductive pad 175*a*, and a second group of lower electrodes 192 selected from among the plurality of lower electrodes 192 may pass through the third interlayer insulating layer 164 and come into contact with the upper surface of the second conductive pad 175*b*.

Figure 9A:
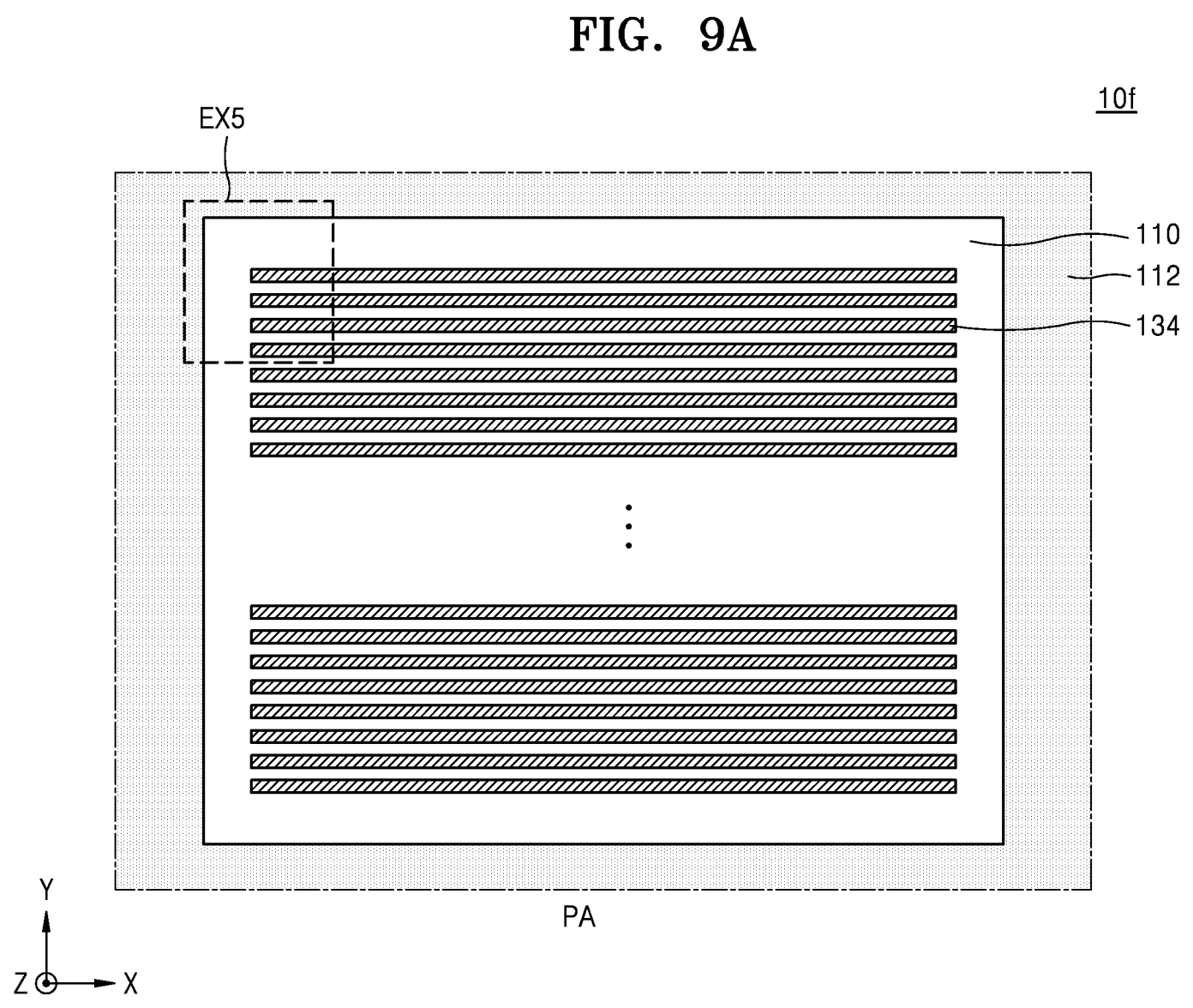
Figure 9B:
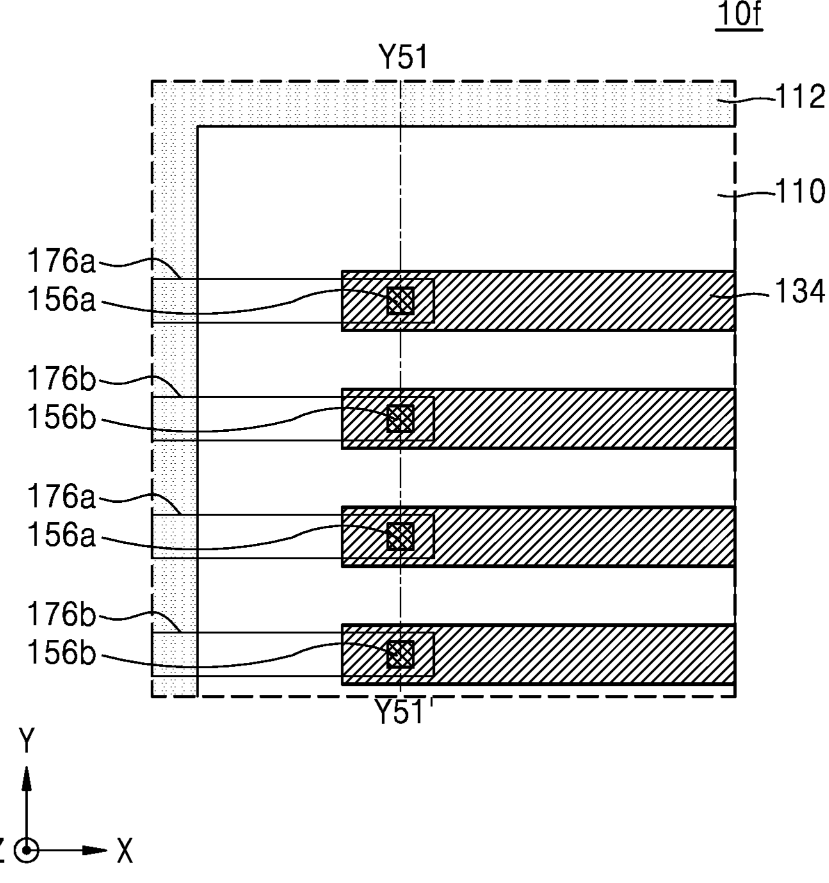
FIG. 9B is an enlarged view of region "EX5" of FIG. 9A.
Figure 9C:
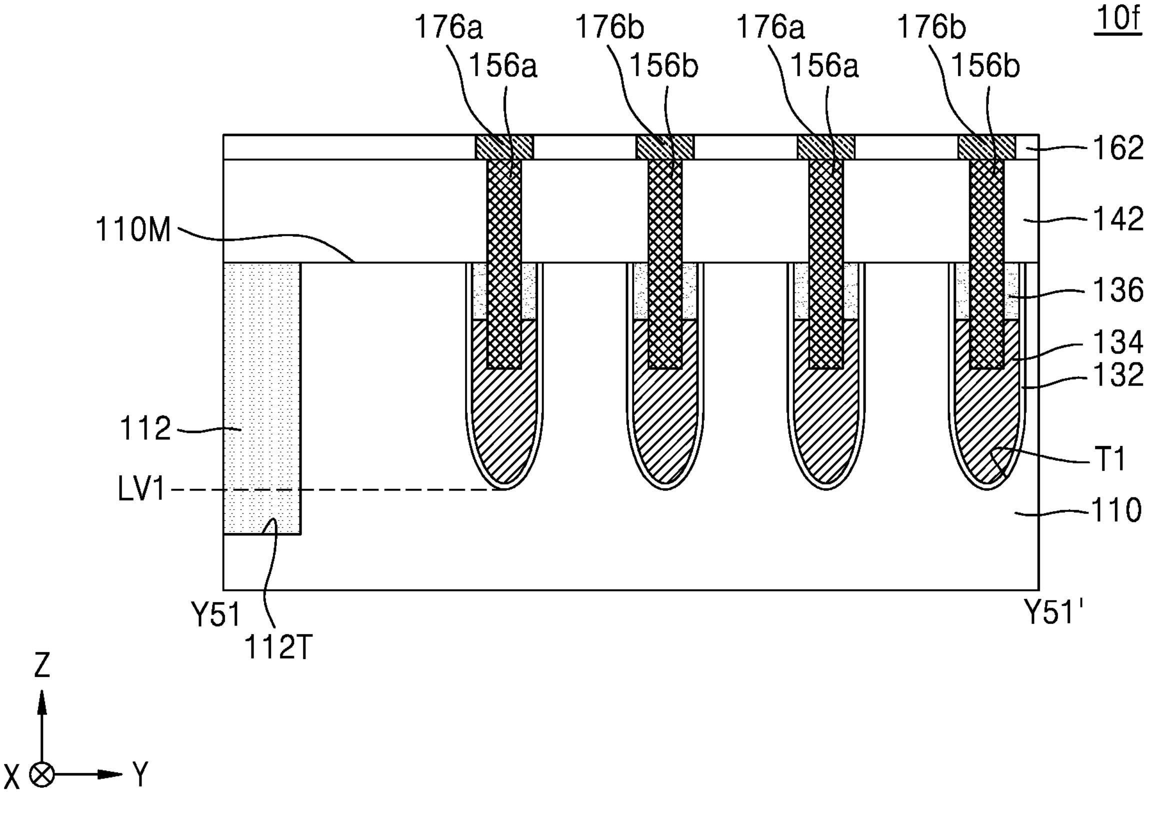
FIG. 9C is a cross-sectional view taken along line Y51-Y51' of FIG. 9B.

FIG. 9A is a schematic plan layout for describing some components of a peripheral circuit region PA of an integrated circuit device 10*f* according to some embodiments. FIG. 9B is an enlarged view of region "EX5" of FIG. 9A. FIG. 9C is a cross-sectional view taken along line Y51-Y51' of FIG. 9B. In FIGS. 9A to 9C, the same reference numerals as those in FIGS. 3A to 3C are given to the same or similar elements, and repeated descriptions thereof may be omitted. However, when an element similar to, or the same as a previously described element includes a difference in the structure, arrangement relationship, etc. of the same member, further description of the element may be provided. In the example of FIGS. 9A to 9C a first well 122 and a second well 124 as described in relation to the integrated circuit device of FIGS. 3A to 3C may be omitted.

Referring to FIGS. 9A to 9C, in a portion of the peripheral circuit region PA, an isolation trench 112T may be formed in a substrate 110 so as to surround a plurality of buried conductive lines 134. Also, an isolation film 112 may be located inside the isolation trench 112T.

In some embodiments, the isolation film 112 may include a silicon oxide film, a silicon nitride film, or a silicon oxynitride film, but embodiments are not limited thereto.

Although not illustrated, the integrated circuit devices 10, 10*a*, 10*b*, 10*c*, 10*d*, and 10*c* described with reference to FIGS. 3A to 8E may further include isolation films that surround the plurality of buried conductive lines 134 in a plan view. In this case, the isolation film may surround the first well 122 or the third well 126 and may be configured to insulate the buried capacitor structure BCS from peripheral elements.

In some embodiments, the plurality of buried conductive lines 134 may face the substrate 110 with lower capacitor dielectric films 132 therebetween. In some embodiments, the plurality of buried conductive lines 134 may be spaced apart from each other in a second horizontal direction (Y direction) with the substrate 110 and the lower capacitor dielectric films 132 therebetween.

In some embodiments, the substrate 110 may be formed of and/or include a semiconductor layer that is not doped with a dopant. In this case, a portion of the substrate 110 may be between a pair of buried conductive lines 134 adjacent to each other in the second horizontal direction (Y direction) among the plurality of buried conductive lines 134 and may serve as a dielectric material to constitute a buried capacitor.

In some embodiments, the bottom surface of the isolation trench 112T may be at a lower vertical level than a first vertical level LV1 that is a vertical level of the bottom surfaces of a plurality of line trenches T1.

According to some embodiments, a plurality of first lower capacitor contacts 156*a* and a plurality of second lower capacitor contacts 156*b* may be disposed above the plurality of buried conductive lines 134. According to some embodiments, the plurality of first lower capacitor contacts 156*a* and the plurality of second lower capacitor contacts 156*b* may pass through a first interlayer insulating layer 142 and a plurality of capping insulating films 136 and may respectively come into contact with the plurality of buried conductive lines 134. In some embodiments, a first group of buried conductive lines 134 selected from among the plurality of buried conductive lines 134 may be respectively connected to respective first lower capacitor contacts 156*a* of the plurality of first lower capacitor contacts 156*a*, and a second group of buried conductive lines 134 selected from among the plurality of buried conductive lines 134 may be respectively connected to respective lower capacitor contacts 156*b* of the plurality of second lower capacitor contacts 156*b*.

According to some embodiments, the first group of buried conductive lines 134 and the second group of buried conductive lines 134 may be alternately arranged in the second horizontal direction (Y direction). According to some embodiments, the plurality of first lower capacitor contacts 156*a* and the plurality of second lower capacitor contacts 156*b* may be alternately arranged in the second horizontal direction (Y direction). For example, a pair of buried conductive lines 134 arranged adjacent to each other among the plurality of buried conductive lines 134 may be connected to different types of capacitor contacts and may receive voltages of different magnitudes.

According to some embodiments, first conductive pads 176*a* extending in a first horizontal direction (X direction) may be disposed on respective first lower capacitor contacts 156*a*. According to some embodiments, the first conductive pads of the plurality of first conductive pads 176*a* may be respectively in contact with the upper surfaces of respective first lower capacitor contacts 156*a* and may be respectively and electrically connected to respective buried conductive lines of the first group of buried conductive lines 134 via the plurality of first lower capacitor contacts 156*a*.

According to some embodiments, respective second conductive pads 176*b* extending in the first horizontal direction (X direction) may be disposed on respective second lower capacitor contacts 156*b*. According to some embodiments, the plurality of second conductive pads 176*b* may be respectively in contact with the upper surfaces of respective second lower capacitor contacts 156*b* and may be respectively and electrically connected to respective buried conductive lines 134 of the second group of buried conductive lines 134 via the plurality of second lower capacitor contacts 156*b*.

In some embodiments, the plurality of first conductive pads 176*a* and the plurality of second conductive pads 176*b* may have line shapes parallel to each other and may extend in the first horizontal direction (X direction). In some embodiments, the plurality of first conductive pads 176*a* and the plurality of second conductive pads 176*b* may be spaced apart from each other in the second horizontal direction (Y direction) with a second interlayer insulating layer 162 therebetween. In some embodiments, the plurality of first conductive pads 176*a* and the plurality of second conductive pads 176*b* may be alternately arranged in the second horizontal direction (Y direction).

Figure 10:
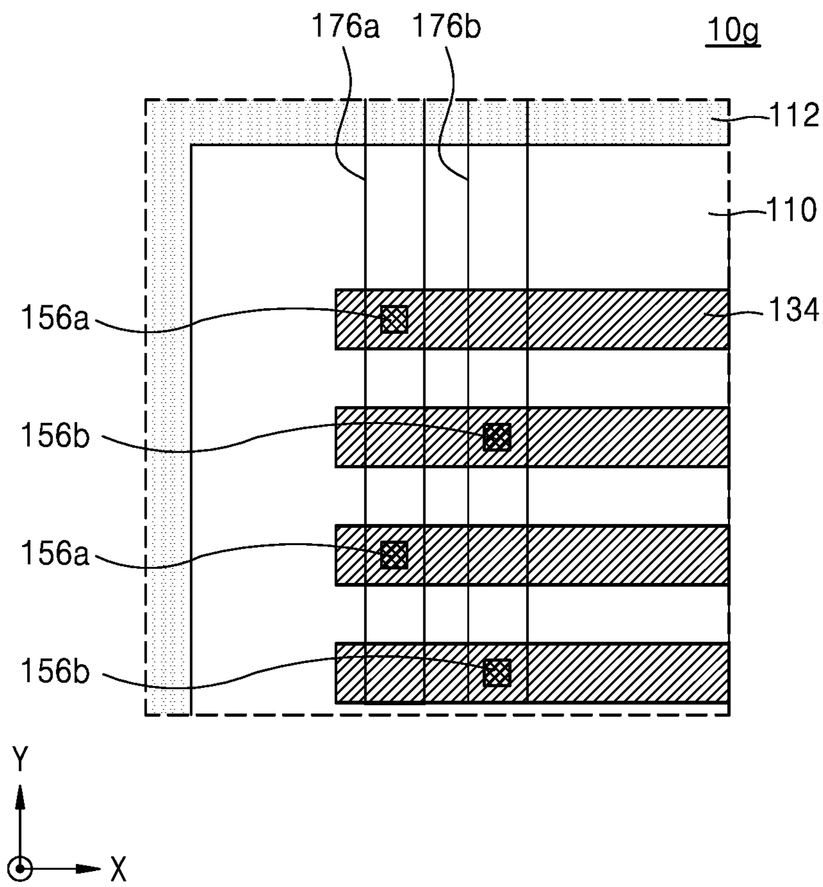
FIG. 10 is a schematic plan layout for describing some components of a peripheral circuit region of an integrated circuit device according to some embodiments and shows a region corresponding to FIG. 9B.

FIG. 10 is a schematic plan layout for describing some components of a peripheral circuit region PA of an integrated circuit device 10*g* according to some embodiments and shows a region corresponding to FIG. 9B. In FIG. 10 a plurality of first lower capacitor contacts 156*a* are connected to a single first conductive pad 176*a*, and a plurality of second lower capacitor contacts 156*b* are connected to a single second conductive pad 176*b*.

Referring to FIG. 10, the plurality of first lower capacitor contacts 156*a* may be connected to the single first conductive pad 176*a* that extends in a second horizontal direction (Y direction) on the plurality of first lower capacitor contacts 156*a*. For example, the plurality of first lower capacitor contacts 156*a* may be arranged in a line in the second horizontal direction (Y direction) respectively on the first group of buried conductive lines 134 and may be connected to the single first conductive pad 176*a* together.

According to some embodiments, the plurality of second lower capacitor contacts 156*b* may be connected to the single second conductive pad 176*b* that extends in the second horizontal direction (Y direction) on the plurality of second lower capacitor contacts 156*b*. For example, the plurality of second lower capacitor contacts 156*b* may be arranged in a line in the second horizontal direction (Y direction) respectively on the second group of buried conductive lines 134 and may be connected to the single second conductive pad 176*b* together.

In some embodiments, the first conductive pad 176*a* and the second conductive pad 176*b* may be spaced apart from each other in a first horizontal direction (X direction) and extend side by side in the second horizontal direction (Y direction). In some embodiments, the plurality of first lower capacitor contacts 156*a* and the plurality of second lower capacitor contacts 156*b* may be arranged offset from each other in the first horizontal direction (X direction) and the second horizontal direction (Y direction) as shown in the schematic plan layout of FIG. 10.

Figure 11A:
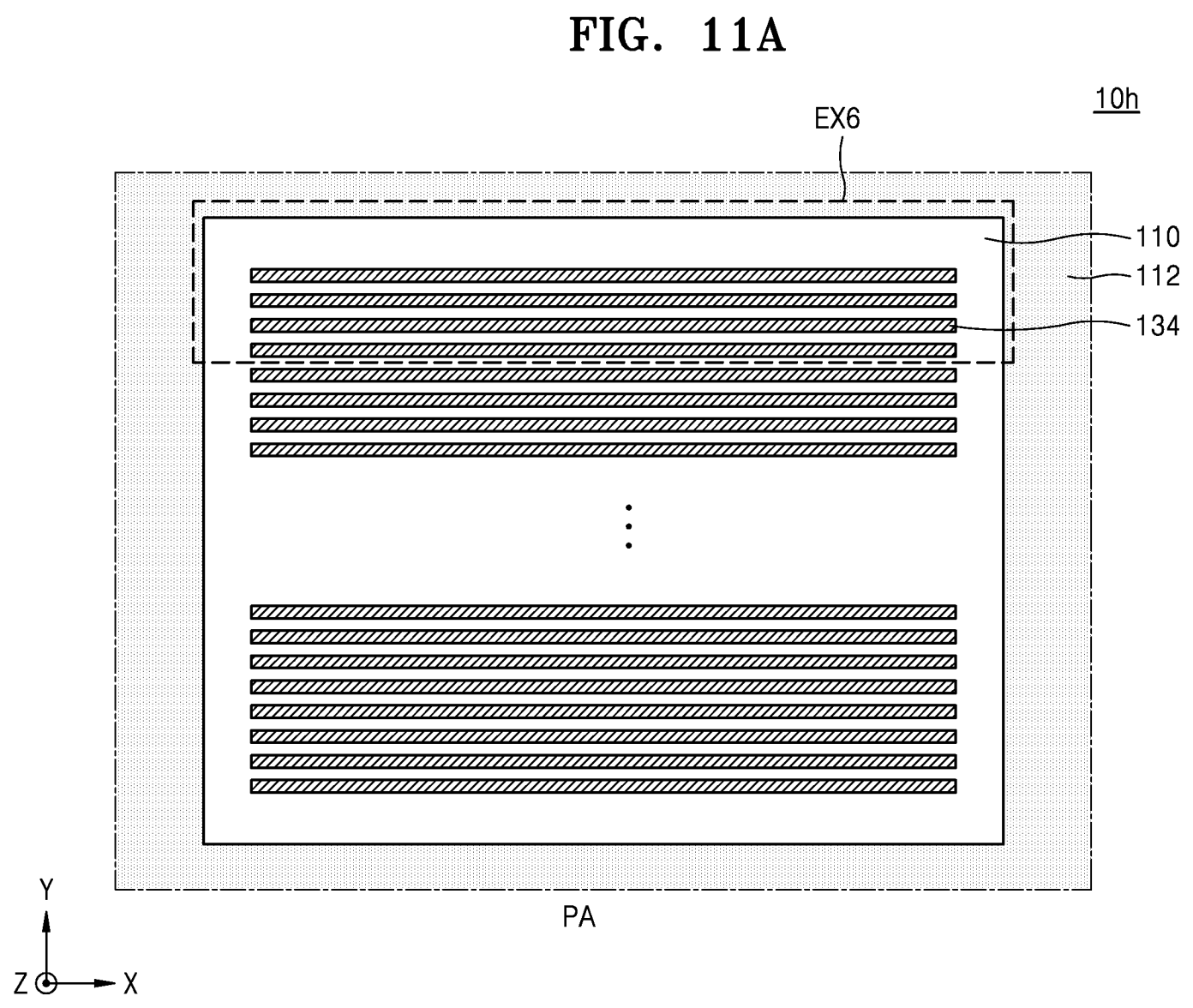
Figure 11B:
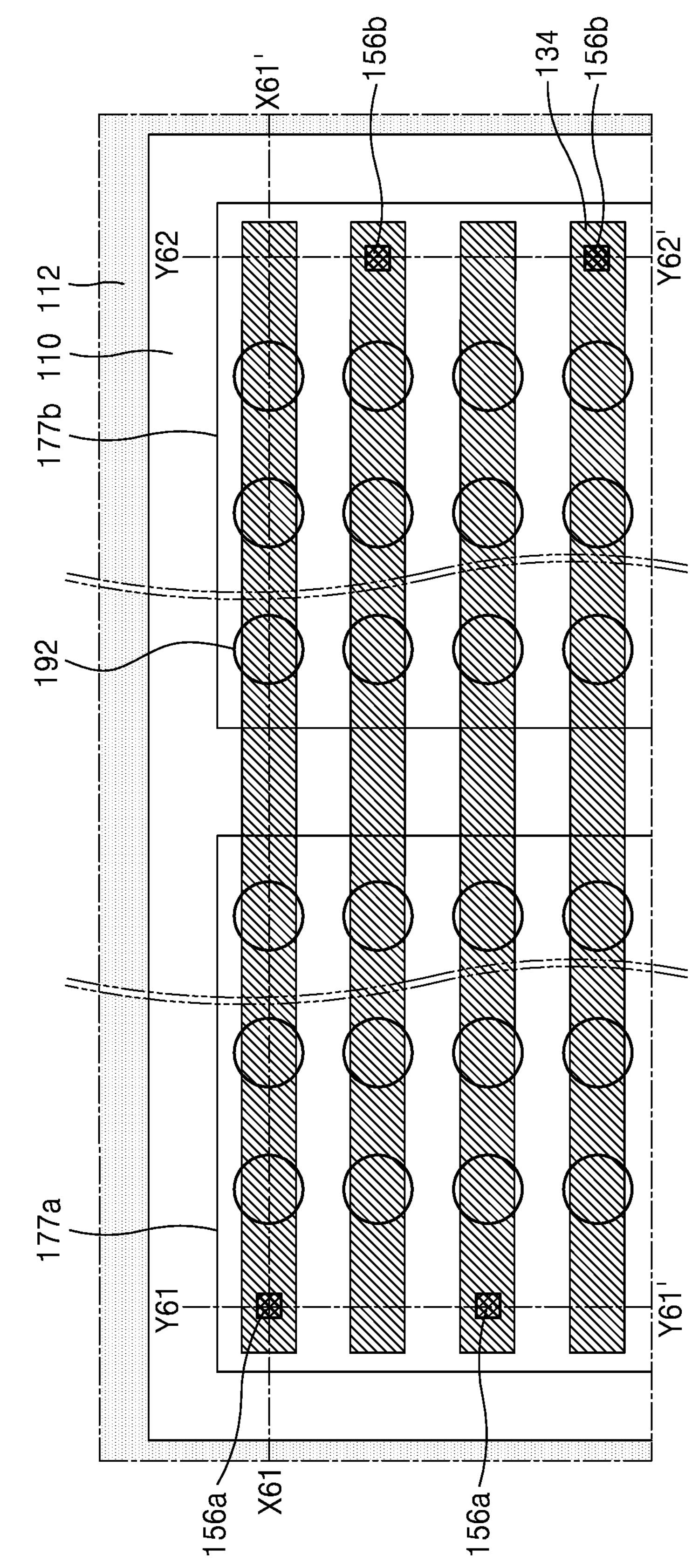
FIG. 11B is an enlarged view of region "EX6" of FIG. 11A.
Figure 11C:
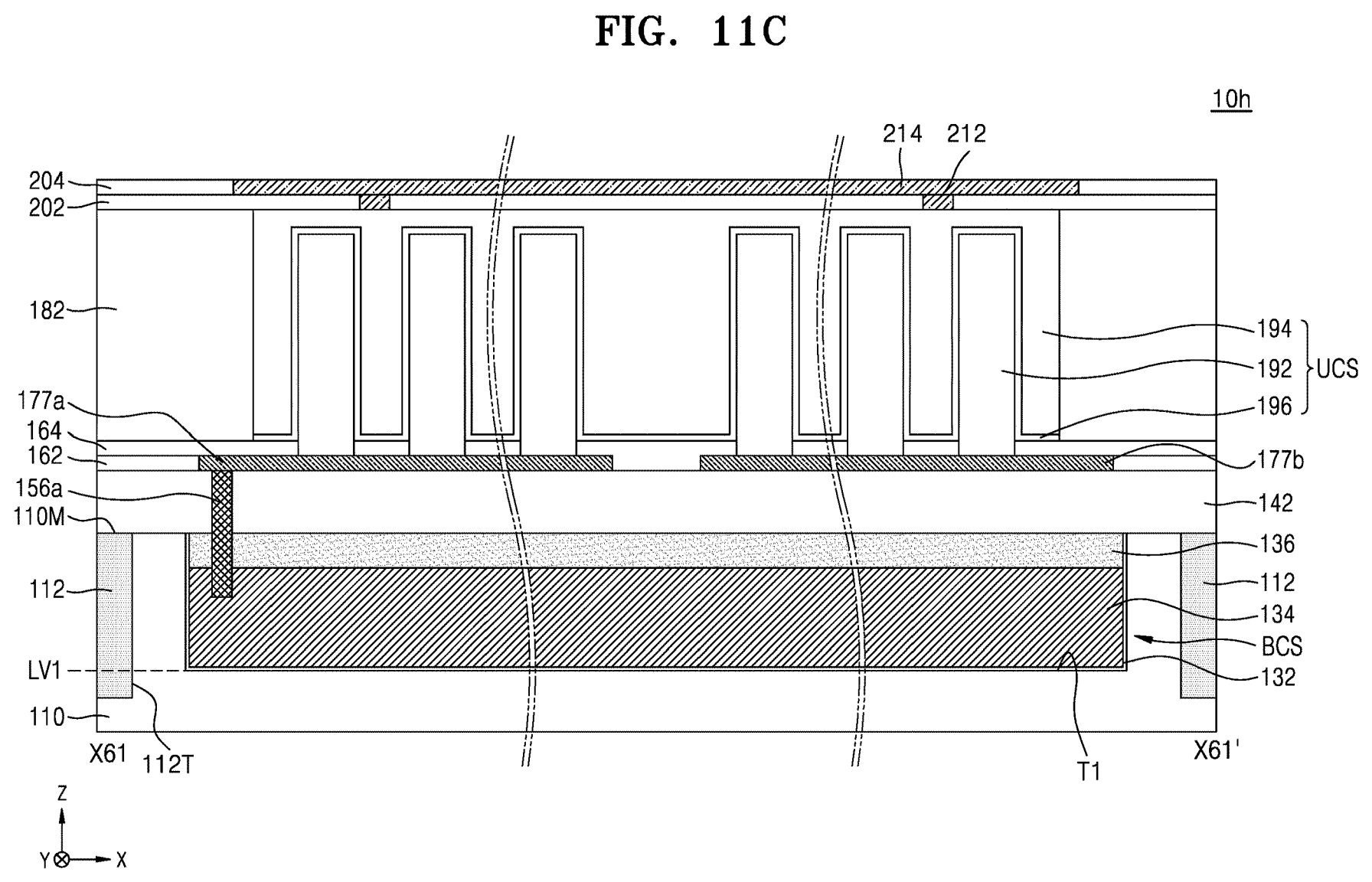
Figure 11D:
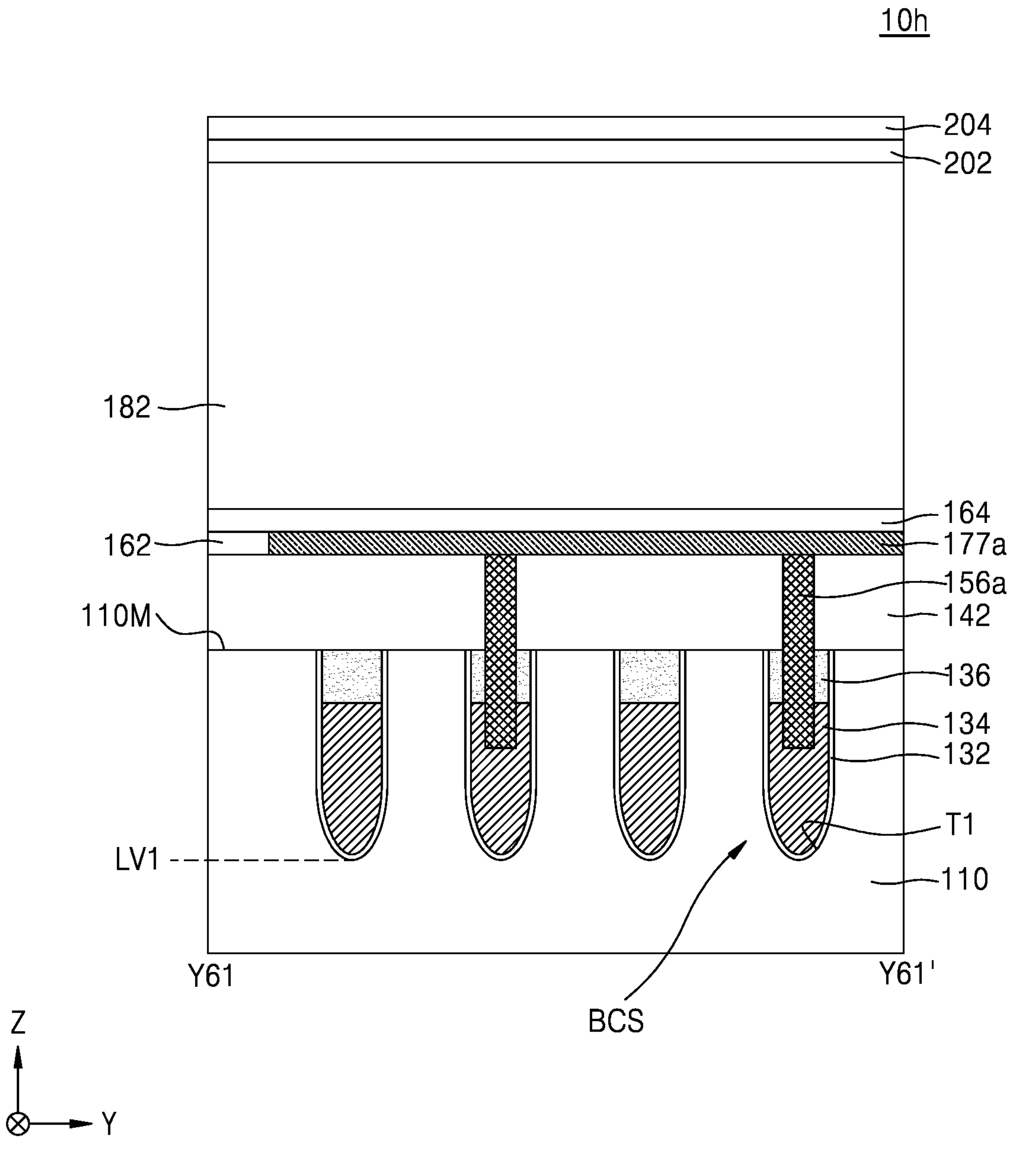
FIG. 11D is a cross-sectional view taken along line Y61-Y61' of FIG. 11B.
Figure 11E:
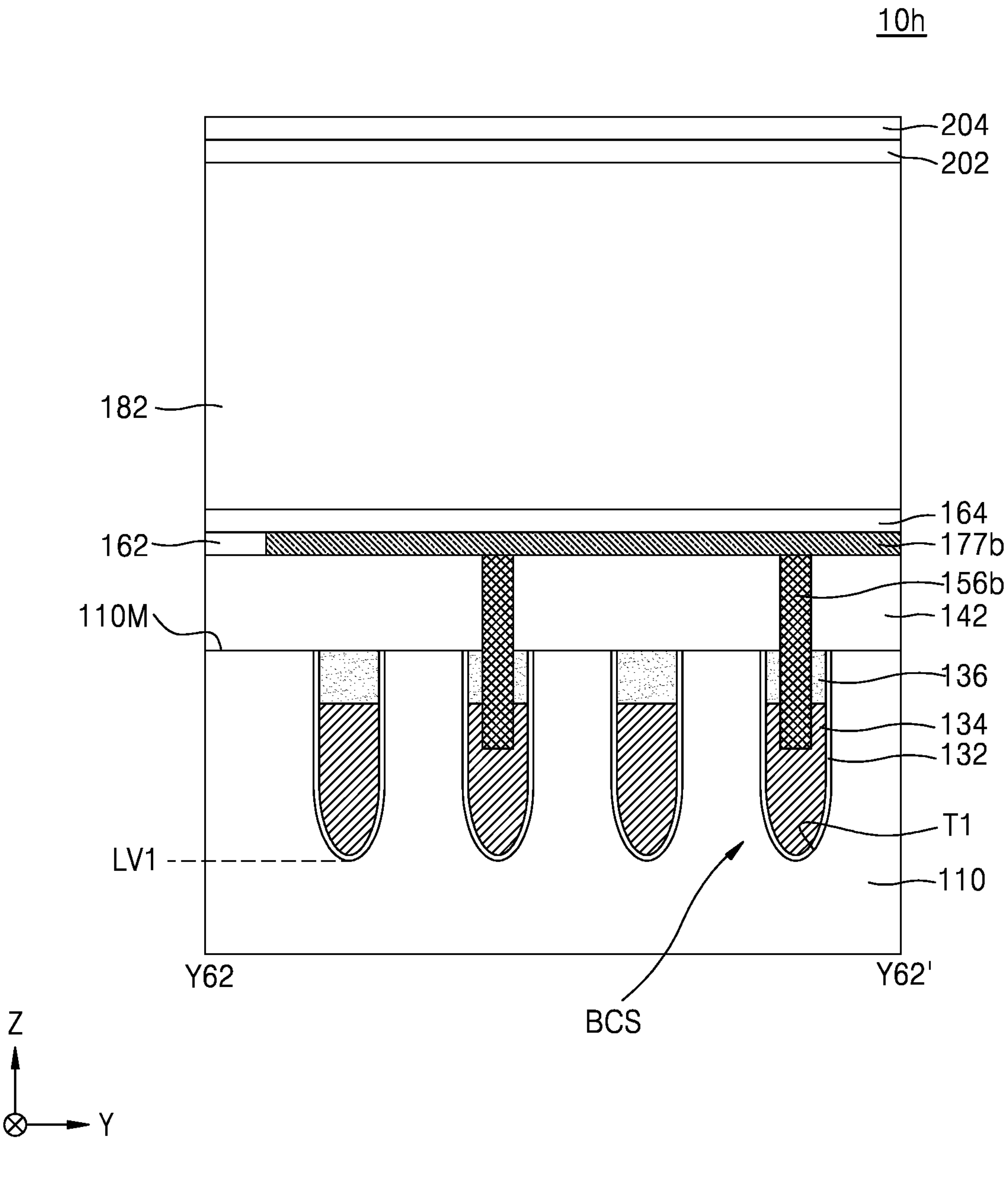
FIG. 11E is a cross-sectional view taken along line Y62-Y62' of FIG. 11B.

FIG. 11A is a schematic plan layout for describing some components of a peripheral circuit region PA of an integrated circuit device 10*h* according to some embodiments. FIG. 11B is an enlarged view of region "EX6" of FIG. 11A. FIG. 11C is a cross-sectional view taken along line X61-X61' of FIG. 11B, FIG. 11D is a cross-sectional view taken along line Y61-Y61' of FIG. 11B, and FIG. 11E is a cross-sectional view taken along line Y62-Y62' of FIG. 11B. In FIGS. 11A to 11E, the same reference numerals as those in FIGS. 9A to 9C and FIGS. 5A to 5E are given to the same or similar elements, and repeated descriptions thereof may be omitted. However, when an element similar to, or the same as, a previously described element includes a difference in the structure, arrangement relationship, etc. of the same member, further description of the element may be provided.

Referring to FIGS. 11A to 11E, first lower capacitor contacts 156*a* of a plurality of first lower capacitor contacts 156*a* and second lower capacitor contacts of a plurality of second lower capacitor contacts 156*b* may be spaced apart from each other in a first horizontal direction (X direction). For example, each of a plurality of buried conductive lines 134 may have a first end and a second end opposite to each other in the first horizontal direction (X direction). In some embodiments, the plurality of first lower capacitor contacts 156*a* may be respectively disposed on a first end of the first group of buried conductive lines 134 and may be in contact with the first group of buried conductive lines 134. In some embodiments, the plurality of second lower capacitor contacts 156*b* may be respectively disposed on a second end (e.g., the opposite end) of the second group of buried conductive lines 134 and may be in contact with the second group of buried conductive lines 134.

According to some embodiments, a first conductive pad 177*a* may be disposed on the plurality of first lower capacitor contacts 156*a* to cover both the upper surfaces of the plurality of first lower capacitor contacts 156*a* and a portion of the upper surface of a first interlayer insulating layer 142. According to some embodiments, a second conductive pad 177*b* may be disposed on the plurality of second lower capacitor contacts 156*b* to cover both the upper surfaces of the plurality of second lower capacitor contacts 156*b* and a portion of the upper surface of the first interlayer insulating layer 142. According to some embodiments, the first conductive pad 177*a* and the second conductive pad 177*b* may be spaced apart from each other in the first horizontal direction (X direction) with a second interlayer insulating layer 162 therebetween and may be insulated from each other.

According to some embodiments, the first conductive pad 177*a* and the second conductive pad 177*b* may have plate shapes, and the planar areas thereof may be larger than those of the plurality of first conductive pads 176*a* and the plurality of second conductive pad 176*b*, respectively, of the integrated circuit device 10*f* described above with reference to FIGS. 9A to 9C. In some embodiments, each of the first conductive pad 177*a* and the second conductive pad 177*b* on the first interlayer insulating layer 142 may overlap the plurality of buried conductive lines 134.

For example, the plurality of first lower capacitor contacts 156*a* may be in contact with the lower surface of the first conductive pad 177*a*, and the first group of buried conductive lines 134 may be electrically connected to the first conductive pad 177*a* via the plurality of first lower capacitor contacts 156*a*. For example, the plurality of second lower capacitor contacts 156*b* may be in contact with the lower surface of the second conductive pad 177*b*, and the second group of buried conductive lines 134 may be electrically connected to the second conductive pad 177*b* via the plurality of second lower capacitor contacts 156*b*.

According to some embodiments, an upper capacitor structure UCS may be disposed on the first conductive pad 177*a* and the second conductive pad 177*b*. According to some embodiments, a first group of lower electrodes 192 selected from among a plurality of lower electrodes 192 may pass through a third interlayer insulating layer 164 and come into contact with the upper surface of the first conductive pad 177*a*, and a second group of lower electrodes 192 selected from among the plurality of lower electrodes 192 may pass through the third interlayer insulating layer 164 and come into contact with the upper surface of the second conductive pad 177*b*.

Figure 12A:
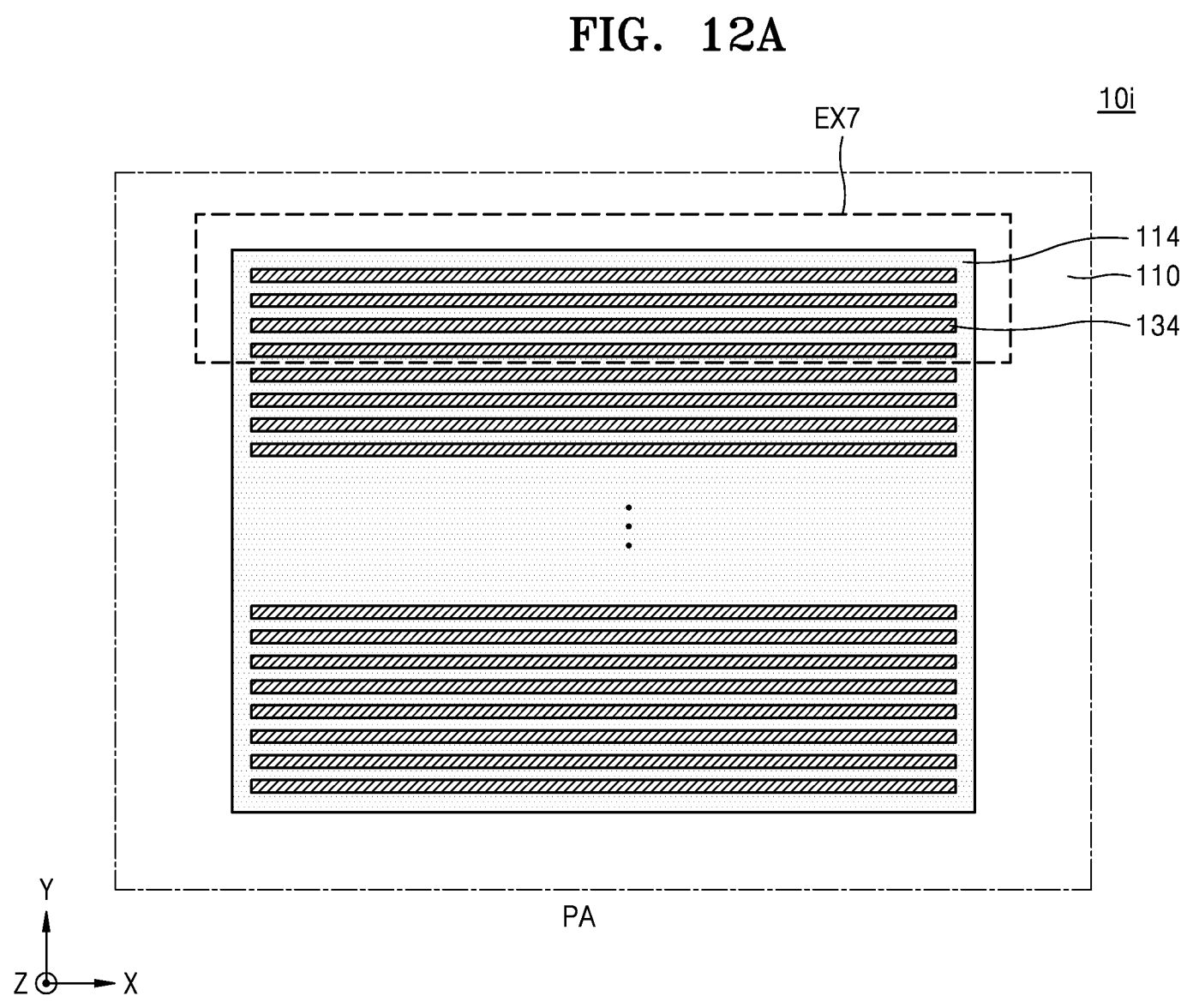
Figure 12B:
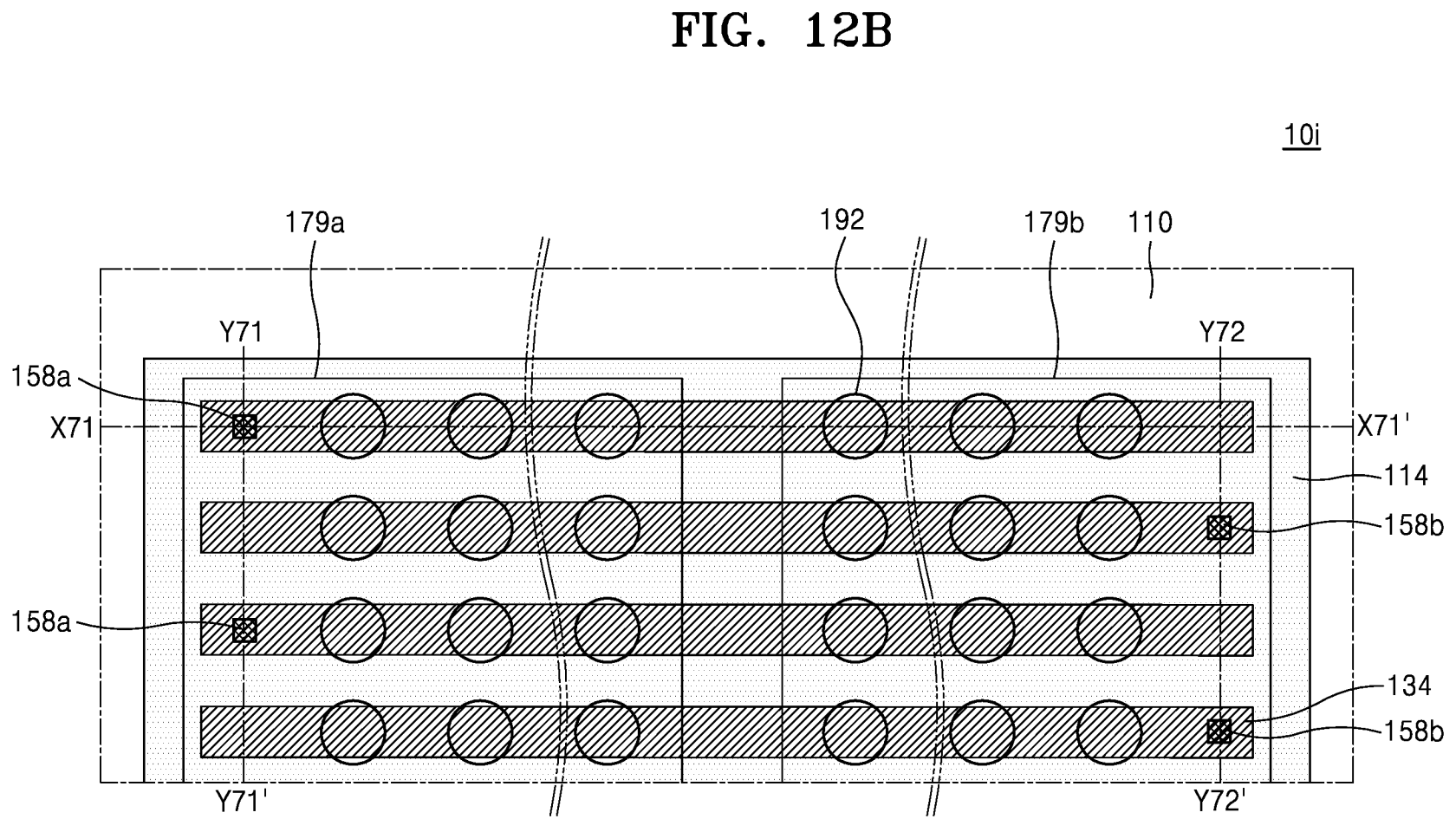
Figure 12C:
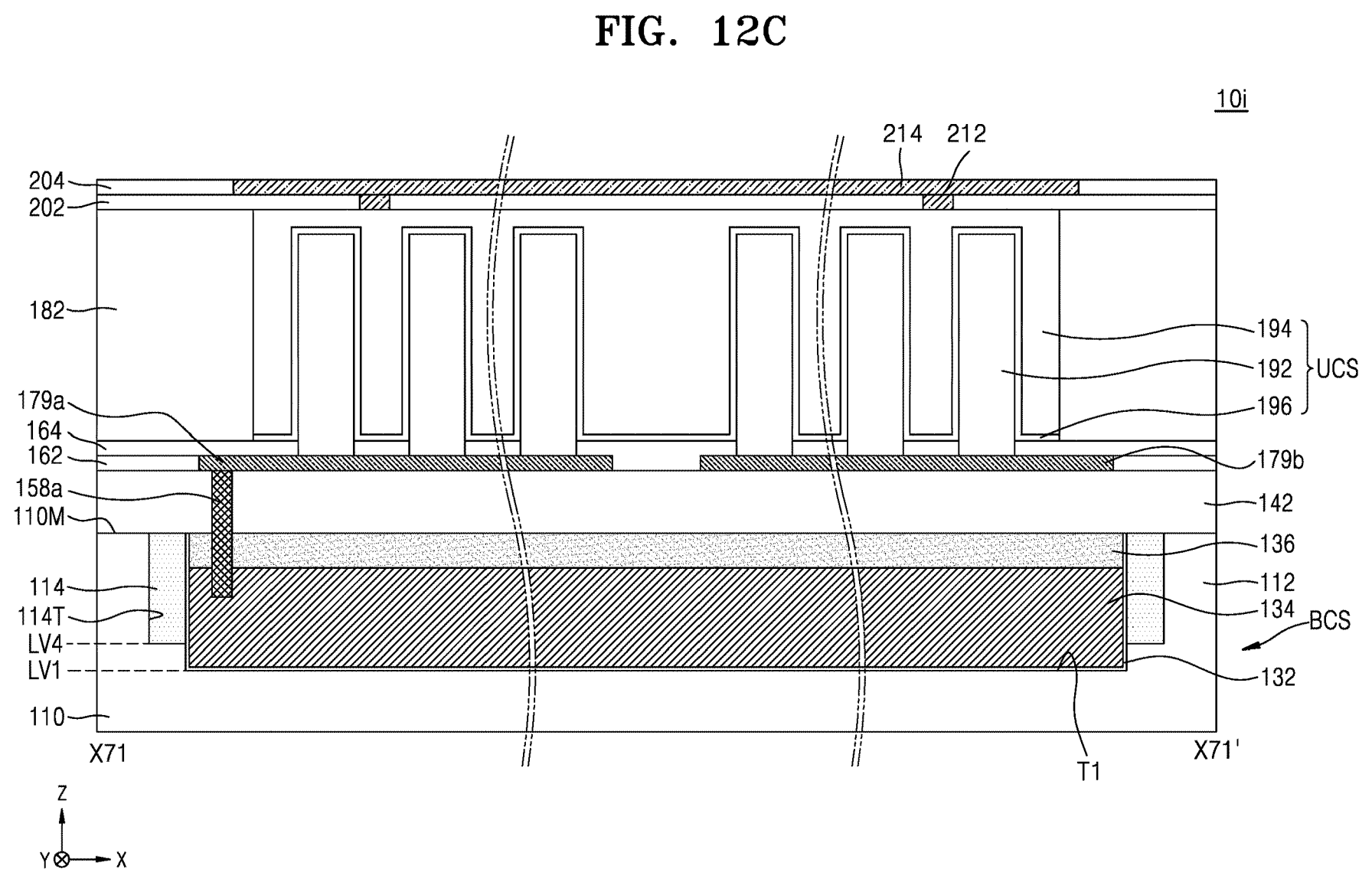
Figure 12D:
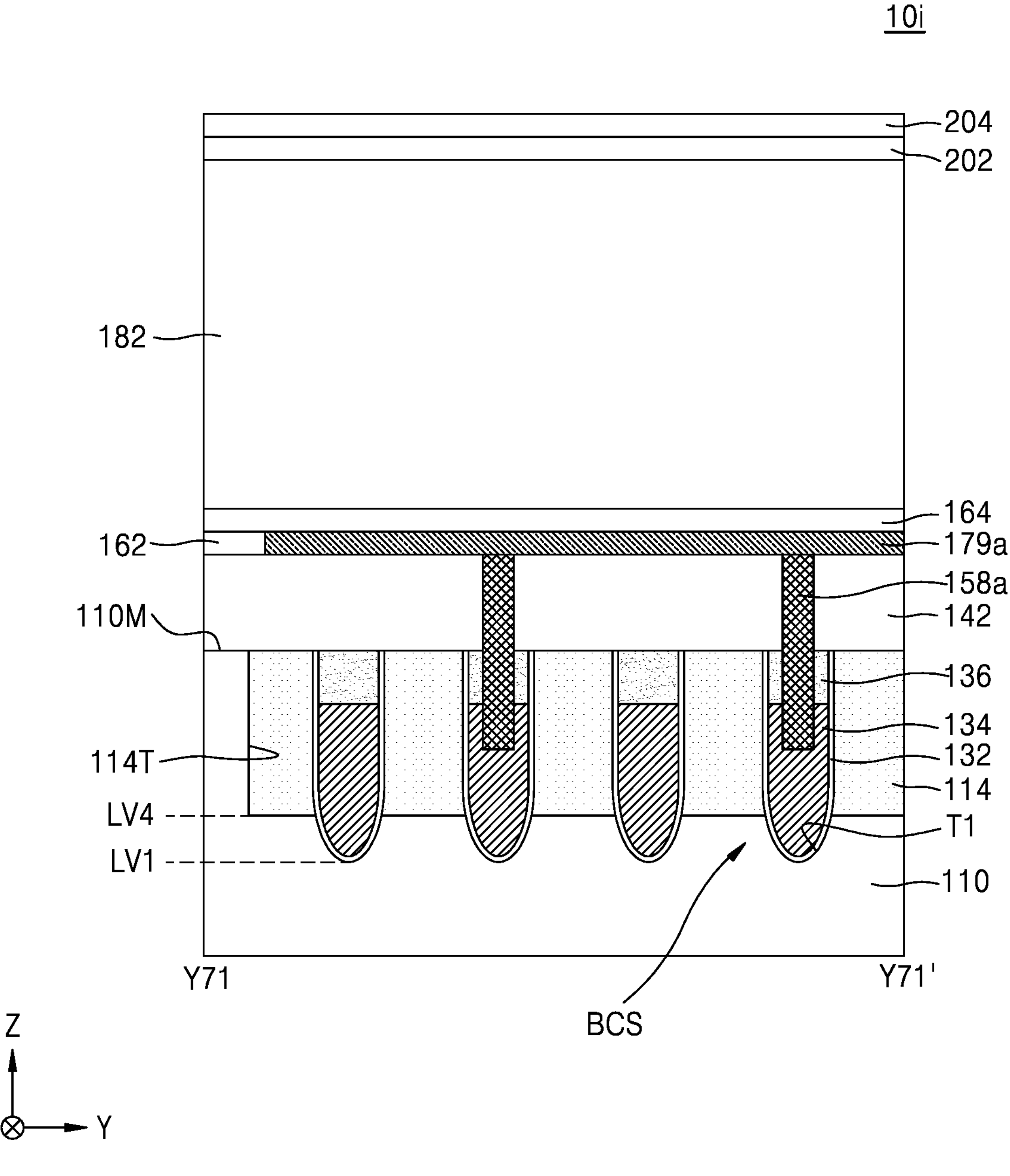
FIG. 12D is a cross-sectional view taken along line Y71-Y71' of FIG. 12B.
Figure 12E:
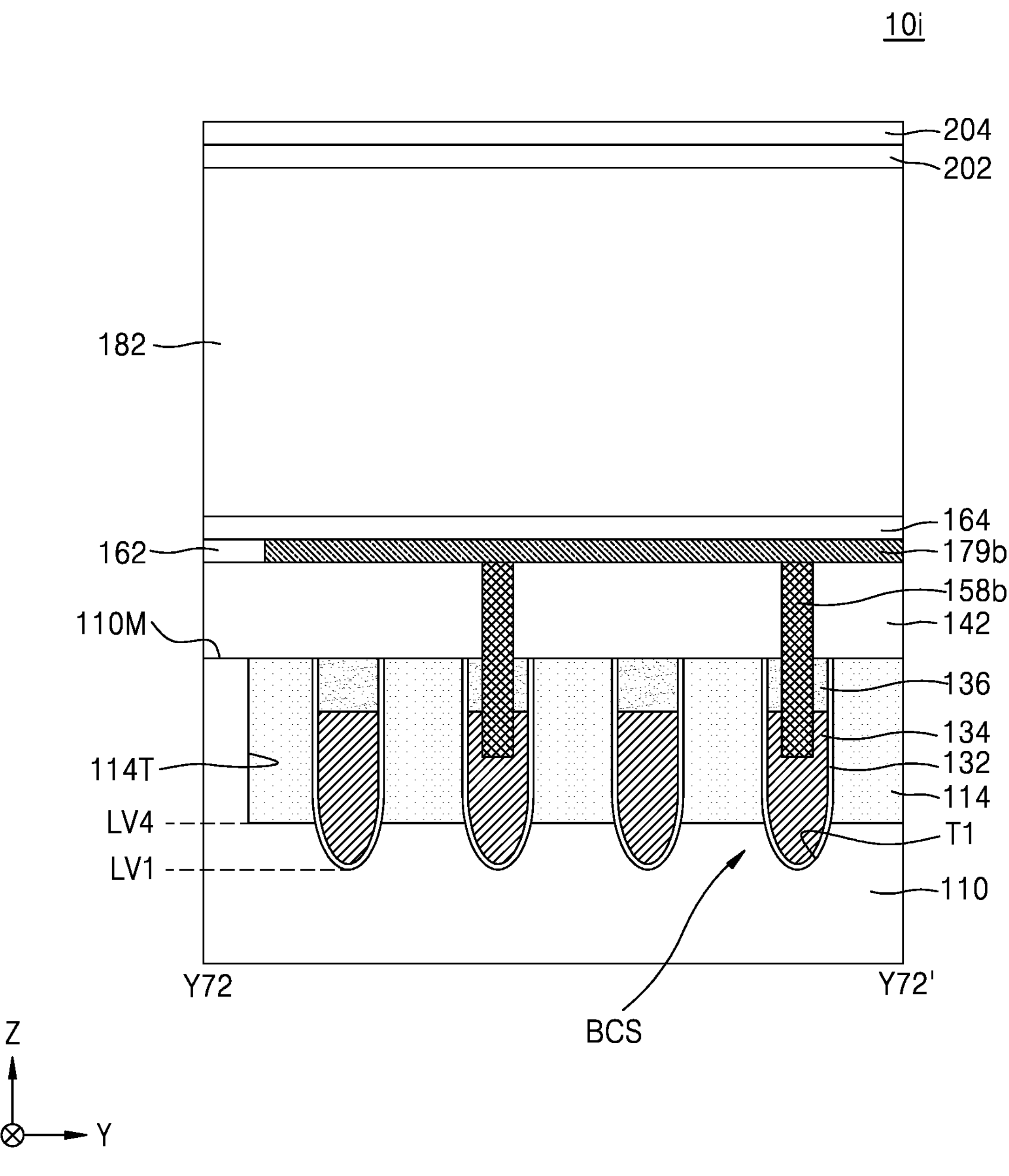
FIG. 12E is a cross-sectional view taken along line Y72-Y72' of FIG. 12B.

FIG. 12A is a schematic plan layout for describing some components of a peripheral circuit region PA of an integrated circuit device 10*i* according to some embodiments. FIG. 12B is an enlarged view of region "EX7" of FIG. 12A. FIG. 12C is a cross-sectional view taken along line X71-X71' of FIG. 12B, FIG. 12D is a cross-sectional view taken along line Y71-Y71' of FIG. 12B, and FIG. 12E is a cross-sectional view taken along line Y72-Y72' of FIG. 12B. In FIGS. 12A to 12E, the same reference numerals as those in FIGS. 11A to 11E are given to the same or similar elements, and repeated descriptions thereof may be omitted. However, when an element similar to, or the same as, a previously described element includes a difference in the structure, arrangement relationship, etc. of the same member, further description of the member may be provided. The integrated circuit device 10*i* described with reference to FIGS. 11A to 11E further includes a dielectric block 114 as compared to the integrated circuit of FIG. 10.

Referring to FIGS. 12A to 12E, the dielectric block 114 may be located in a dielectric block trench 114T that is formed in an upper portion of a substrate 110. For example, an upper surface of the dielectric block 114 may be at the same vertical level as a main surface 110M of the substrate 110. According to some embodiments, the dielectric block 114 may have a rectangular shape in a plan view, but embodiments are not limited thereto.

In some embodiments, the dielectric block 114 may include at least one material selected from among a silicon oxide film, a silicon nitride film, a silicon oxynitride film, or a high-k dielectric film having a higher dielectric constant than the silicon oxide film, but embodiments are not limited thereto.

According to some embodiments, a plurality of line trenches T1 may extend in a first horizontal direction (X direction) and pass through the dielectric block 114 in a vertical direction (Z direction). In some embodiments, a plurality of buried conductive lines 134 may be located one by one (e.g., side by side with a horizontal space separating adjacent buried conductive lines) inside the plurality of line trenches T1.

In some embodiments, the bottom surface of the dielectric block 114 may be at a fourth vertical level LV4 higher than a first vertical level LV1 that is a vertical level of the bottom surfaces of the plurality of line trenches T1. In some embodiments, the bottom surfaces of the plurality of buried conductive lines 134 may be at a vertical level lower than the fourth vertical level LV4. In some embodiments, the upper surfaces of the plurality of buried conductive lines 134 may be at a vertical level higher than the fourth vertical level LV4.

According to some embodiments, the plurality of buried conductive lines 134 may be spaced apart from each other with lower capacitor dielectric films 132 and the dielectric block 114 therebetween. In some embodiments, both longitudinal (extending lengthwise) side surfaces of each of the plurality of buried conductive lines 134 may face the dielectric block 114 in a second horizontal direction (Y direction) with a lower capacitor dielectric film 132 interposed therebetween.

FIGS. 12A to 12C illustrate that the bottom surface of the dielectric block 114 is at the fourth vertical level LV4 higher than the first vertical level LV1 of the bottom surfaces of the plurality of line trenches T1, but embodiments are not limited thereto. For example, the bottom surface of the dielectric block 114 may be at the same vertical level as the first vertical level LV1 or at a vertical level lower than the first vertical level LV1. In this case, the plurality of buried conductive lines 134 may have a structure buried inside the dielectric block 114.

In some embodiments, a plurality of first lower capacitor contacts 158*a* and a plurality of second lower capacitor contacts 158*b* may be disposed above the plurality of buried conductive lines 134. According to some embodiments, the plurality of first lower capacitor contacts 158*a* and the plurality of second lower capacitor contacts 158*b* may pass through a first interlayer insulating layer 142 and a plurality of capping insulating films 136 and may respectively come into contact with the plurality of buried conductive lines 134. In some embodiments, a first group of buried conductive lines 134 selected from among the plurality of buried conductive lines 134 may be respectively connected to respective first lower capacitor contacts 158*a*, and a second group of buried conductive lines 134 selected from among the plurality of buried conductive lines 134 may be respectively connected to respective second lower capacitor contacts 158*b*.

In some embodiments, the first group of buried conductive lines 134 and the second group of buried conductive lines 134 may be alternately arranged in the second horizontal direction (Y direction). For example, a pair of buried conductive lines 134 arranged adjacent to each other among the plurality of buried conductive lines 134 may be connected to different types of capacitor contacts and may receive voltages of different magnitudes.

In some embodiments, the plurality of first lower capacitor contacts 158*a* and the plurality of second lower capacitor contacts 158*b* may be spaced apart from each other in the first horizontal direction (X direction). For example, each of the plurality of buried conductive lines 134 may have a first end and a second end opposite to the first end in the first horizontal direction (X direction). In some embodiments, the plurality of first lower capacitor contacts 158*a* may be respectively disposed on a first end of the first group of buried conductive lines 134 and may be in contact with the first group of buried conductive lines 134. In some embodiments, the plurality of second lower capacitor contacts 158*b* may be respectively disposed on a second end (e.g., the opposite end) of the second group of buried conductive lines 134 and may be in contact with the second group of buried conductive lines 134.

In some embodiments, a first conductive pad 179*a* may be disposed on the plurality of first lower capacitor contacts 158*a* to cover both the upper surfaces of the plurality of first lower capacitor contacts 158*a* and a portion of the upper surface of the first interlayer insulating layer 142. According to some embodiments, a second conductive pad 179*b* may be disposed on the plurality of second lower capacitor contacts 158*b* to cover both the upper surfaces of the plurality of second lower capacitor contacts 158*b* and a portion of the upper surface of the first interlayer insulating layer 142.

In some embodiments, the first conductive pad 179*a* may be in contact with the upper surfaces of the plurality of first lower capacitor contacts 158*a* and may be electrically connected to the first group of buried conductive lines 134 via the plurality of first lower capacitor contacts 158*a*. In some embodiments, the second conductive pad 179*b* may be in contact with the upper surfaces of the plurality of second lower capacitor contacts 158*b* and may be electrically connected to the second group of buried conductive lines 134 via the plurality of second lower capacitor contacts 158*b*.

In some embodiments, the first conductive pad 179*a* and the second conductive pad 179*b* may each have a plate shape. In some embodiments, the first conductive pad 179*a* and the second conductive pad 179*b* may be spaced apart from each other in the first horizontal direction (X direction) with a second interlayer insulating layer 162 therebetween and may be insulated from each other. In some embodiments, the first conductive pad 179*a* and the second conductive pad 179*b* on the first interlayer insulating layer 142 may overlap both the plurality of buried conductive lines 134 and the dielectric block 114.

For example, the plurality of first lower capacitor contacts 158*a* may be in contact with the lower surface of the first conductive pad 179*a*, and the first group of buried conductive lines 134 may be electrically connected to the first conductive pad 179*a* via the plurality of first lower capacitor contacts 158*a*. For example, the plurality of second lower capacitor contacts 158*b* may be in contact with the lower surface of the second conductive pad 179*b*, and the second group of buried conductive lines 134 may be electrically connected to the second conductive pad 179*b* via the plurality of second lower capacitor contacts 158*b*.

According to some embodiments, an upper capacitor structure UCS may be disposed on the first conductive pad 179*a* and the second conductive pad 179*b*. According to some embodiments, a first group of lower electrodes 192 selected from among a plurality of lower electrodes 192 may pass through a third interlayer insulating layer 164 and come into contact with the upper surface of the first conductive pad 179*a*, and a second group of lower electrodes 192 selected from among the plurality of lower electrodes 192 may pass through the third interlayer insulating layer 164 and come into contact with the upper surface of the second conductive pad 179*b*.

While the inventive concept has been particularly shown and described with reference to embodiments thereof, it will be understood that various changes in form and details may be made therein without departing from the spirit and scope of the following claims.

What is claimed is:

1. An integrated circuit device comprising:

a substrate comprising a cell array region and a peripheral circuit region;

a first ion implantation region located in an upper portion of the substrate in the peripheral circuit region, the first ion implantation region having a plurality of line trenches that extend in a first horizontal direction and cross the first ion implantation region;

a plurality of lower capacitor dielectric films with each lower capacitor dielectric film configured to respectively cover inner walls of a respective line trench of the plurality of line trenches;

a plurality of buried conductive lines that each partially fill a respective line trench of the plurality of line trenches and that are each respectively disposed on a respective lower capacitor dielectric film of the plurality of lower capacitor dielectric films;

a plurality of first lower capacitor contacts that are each respectively in contact with a respective buried conductive line of the plurality of buried conductive lines; and a plurality of second lower capacitor contacts that are in contact with the first ion implantation region.

2. The integrated circuit device of claim 1, further comprising a second ion implantation region that is located in an upper portion of the first ion implantation region and spaced apart from the plurality of buried conductive lines, wherein the plurality of second lower capacitor contacts are in contact with the second ion implantation region.

3. The integrated circuit device of claim 2, further comprising:

a plurality of first conductive pads that are each disposed on a respective first lower capacitor contact of the plurality of first lower capacitor contacts and that are each connected to a respective first lower capacitor contact of the plurality of first lower capacitor contacts; and a second conductive pad which is disposed on the plurality of second lower capacitor contacts and connected to all of the plurality of second lower capacitor contacts.

4. The integrated circuit device of claim 2, wherein the first ion implantation region and the second ion implantation region are each doped with a dopant having the same conductivity type, and a doping concentration of the second ion implantation region is greater than a doping concentration of the first ion implantation region.

5. The integrated circuit device of claim 1, wherein a bottom surface of the first ion implantation region is at a lower vertical level than bottom surfaces of the plurality of line trenches, and the plurality of buried conductive lines are arranged inside the first ion implantation region.

6. The integrated circuit device of claim 1, wherein a bottom surface of the first ion implantation region is at a higher vertical level than bottom surfaces of the plurality of line trenches, and the plurality of buried conductive lines comprise portions that protrude from the bottom surface of the first ion implantation region into the substrate in a vertical direction.

7. The integrated circuit device of claim 1, wherein the plurality of buried conductive lines comprise portions that protrude horizontally from a boundary of the first ion implantation region.

8. The integrated circuit device of claim 1, wherein the second lower capacitor contacts of the plurality of second lower capacitor contacts are each arranged between two adjacent buried conductive lines of the plurality of buried conductive lines and spaced apart from each other in a second horizontal direction perpendicular to the first horizontal direction with a buried conductive line of the plurality of buried conductive lines therebetween.

9. The integrated circuit device of claim 8, further comprising:

a first conductive pad that extends in the second horizontal direction on the plurality of first lower capacitor contacts and are in contact with the plurality of first lower capacitor contacts; and a second conductive pad that extends in the second horizontal direction on the plurality of second lower capacitor contacts and are in contact with the plurality of second lower capacitor contacts, wherein the first conductive pad and the second conductive pad are spaced apart from each other in the first horizontal direction.

10. The integrated circuit device of claim 1, further comprising:

a first conductive pad having a plate shape, which is disposed on the plurality of first lower capacitor contacts and is in contact with the plurality of first lower capacitor contacts; and a second conductive pad having a plate shape, which is spaced apart from the first conductive pad and which is disposed on the plurality of second lower capacitor contacts and is in contact with the plurality of second lower capacitor contacts; and an upper capacitor structure disposed on the first conductive pad and the second conductive pad.

11. The integrated circuit device of claim 10, wherein the upper capacitor structure comprises:

a plurality of lower electrodes connected to the first conductive pad or the second conductive pad;

an upper electrode configured to surround the plurality of lower electrodes; and an upper capacitor dielectric film between the plurality of lower electrodes and the upper electrode, wherein a first group of lower electrodes selected from among the plurality of lower electrodes are connected to the first conductive pad, and a second group of lower electrodes selected from among the plurality of lower electrodes are connected to the second conductive pad.

12. The integrated circuit device of claim 10, wherein the upper capacitor structure overlaps the plurality of buried conductive lines in a vertical direction.

13. An integrated circuit device comprising:

a substrate comprising a cell array region and a peripheral circuit region having a plurality of line trenches that extend in a first horizontal direction in the peripheral circuit region;

a plurality of buried conductive lines that are each respectively arranged inside a respective line trench of the plurality of line trenches;

a plurality of first lower capacitor contacts that are each in contact with a respective buried conductive line of a first group of buried conductive lines selected from among the plurality of buried conductive lines; and a plurality of second lower capacitor contacts that are each in contact with a respective buried conductive line of a second group of buried conductive lines selected from among the plurality of buried conductive lines, wherein the first group of buried conductive lines and the second group of buried conductive lines are arranged to alternate between a buried conductive line of the first group of buried conductive lines and a buried conductive line of the second group of buried conductive lines along a second horizontal direction perpendicular to the first horizontal direction.

14. The integrated circuit device of claim 13, further comprising a substrate having a dielectric block trench in an upper portion in the peripheral circuit region and a dielectric block located in the dielectric block trench, wherein the plurality of buried conductive lines are arranged across the dielectric block in the first horizontal direction, and a bottom surface of the dielectric block is at a higher vertical level than bottom surfaces of the plurality of line trenches.

15. The integrated circuit device of claim 13, further comprising:

a plurality of first conductive pads that each extend in the first horizontal direction on a respective first lower capacitor contact of the plurality of first lower capacitor contacts and that are each respectively connected to a respective first lower capacitor contact of the plurality of first lower capacitor contacts; and a plurality of second conductive pads that each extend in the first horizontal direction on a respective second lower capacitor contact of the plurality of second lower capacitor contacts and are each respectively connected to a respective second lower capacitor contact of the plurality of second lower capacitor contacts.

16. The integrated circuit device of claim 13, further comprising:

a first conductive pad that extends in the second horizontal direction on the plurality of first lower capacitor contacts and is connected to all of the plurality of first lower capacitor contacts; and a second conductive pad that extends in the second horizontal direction on the plurality of second lower capacitor contacts and is connected to all of the plurality of second lower capacitor contacts.

17. An integrated circuit device comprising:

a substrate comprising a cell array region and a peripheral circuit region;

a buried capacitor structure located inside the substrate in the peripheral circuit region;

an upper capacitor structure disposed above the substrate in the peripheral circuit region;

a first conductive pad and a second conductive pad, which are each connected to the upper capacitor structure above the substrate;

a plurality of first lower capacitor contacts configured to connect the first conductive pad to the buried capacitor structure; and a plurality of second lower capacitor contacts configured to connect the second conductive pad to the buried capacitor structure, wherein the buried capacitor structure comprises:

a first ion implantation region located in an upper portion of the substrate;

a plurality of lower capacitor dielectric films with each lower capacitor dielectric film configured to respectively cover inner walls of a respective line trench of a plurality of line trenches that extend in a first horizontal direction and cross the first ion implantation region; and a plurality of buried conductive lines that each partially fill a respective line trench of the plurality of line trenches and that are each respectively disposed on a respective lower capacitor dielectric film of the plurality of lower capacitor dielectric films, wherein the plurality of first lower capacitor contacts are each respectively in contact with a respective buried conductive line of the plurality of buried conductive lines, and the plurality of second lower capacitor contacts are in contact with the first ion implantation region.

18. The integrated circuit device of claim 17, wherein a bottom surface of the first ion implantation region is at a higher vertical level than bottom surfaces of the plurality of line trenches, the first ion implantation region comprises a plurality of sub wells that are arranged with each sub well of the plurality of sub wells between respective buried conductive lines of the plurality of buried conductive lines and spaced apart from each other in a second horizontal direction perpendicular to the first horizontal direction, and the plurality of second lower capacitor contacts are each individually in contact with a respective sub well of the plurality of sub wells.

19. The integrated circuit device of claim 17, wherein the upper capacitor structure comprises:

a plurality of lower electrodes connected to the first conductive pad or the second conductive pad;

an upper electrode configured to surround the plurality of lower electrodes; and an upper capacitor dielectric film between the plurality of lower electrodes and the upper electrode, wherein a first group of lower electrodes selected from among the plurality of lower electrodes are connected to the first conductive pad, and a second group of lower electrodes selected from among the plurality of lower electrodes are connected to the second conductive pad.

20. The integrated circuit device of claim 17, wherein the buried capacitor structure and the upper capacitor structure overlap each other in a vertical direction.

* * * * *